(12) United States Patent
Berniard et al.

(10) Patent No.: US 8,950,324 B2
(45) Date of Patent: Feb. 10, 2015

(54) APPARATUS AND METHOD FOR MICROCONTACT PRINTING USING A PRESSURIZED ROLLER

(75) Inventors: Tracie J. Berniard, Saint Paul, MN (US); Matthew H. Frey, Cottage Grove, MN (US); Lance E. Behymer, Woodbury, MN (US); Mikhail L. Pekurovsky, Bloomington, MN (US); Richard W. Greger, Saint Paul, MN (US); Daniel P. Meehan, Saint Paul, MN (US); Jonathan J. O'Hare, Oakdale, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 80 days.

(21) Appl. No.: 13/514,170

(22) PCT Filed: Dec. 17, 2010

(86) PCT No.: PCT/US2010/060912
§ 371 (c)(1),
(2), (4) Date: Jun. 6, 2012

(87) PCT Pub. No.: WO2011/079032
PCT Pub. Date: Jun. 30, 2011

(65) Prior Publication Data
US 2012/0247355 A1 Oct. 4, 2012

Related U.S. Application Data

(60) Provisional application No. 61/288,945, filed on Dec. 22, 2009.

(51) Int. Cl.
*B41K 3/28* (2006.01)
*B41F 3/18* (2006.01)
*H01L 21/027* (2006.01)

(52) U.S. Cl.
CPC .................................. *B41K 3/28* (2013.01)
USPC ...................... 101/250; 101/269; 101/483

(58) Field of Classification Search
CPC ............... B41K 3/28; B41F 3/18; B41F 3/20; H01L 21/027; H01L 21/0271
USPC .......................... 101/250, 269, 483; 977/887
See application file for complete search history.

(56) References Cited

U.S. PATENT DOCUMENTS 3,866,572 A * 2/1975 Gundlach ..................... 399/313
RE32,228 E 8/1986 Van der Velden
(Continued)

FOREIGN PATENT DOCUMENTS

JP 09-106585 4/1997
JP 09-330660 12/1997
(Continued)

OTHER PUBLICATIONS

Bietsch, "Conformal Contact and Pattern Stability of Stamps Used for Soft Lithography", Journal of Applied Physics, Oct. 1, 2000, vol. 88, No. 7, pp. 4310-4318.
(Continued)

*Primary Examiner* — Blake A Tankersley
(74) *Attorney, Agent, or Firm* — Adrian L. Pishko; Jean A. Lown

(57) ABSTRACT

An apparatus and method for microcontact printing are described. The microcontact printing apparatus includes a planar stamp and a pressurized roller. The pressurized roller includes an inflatable bladder that can be inflated by a fluid to a pressure that reduces printing defects such as voids and stamp collapse. A substrate is disposed between the pressurized roller and a stamp coated with an ink of functionalizing molecules. As the pressurized roller moves over the substrate, at least a portion of the functionalizing molecules are transferred from the stamp to the substrate in the desired pattern.

19 Claims, 15 Drawing Sheets

(56) References Cited

U.S. PATENT DOCUMENTS

| | | | |
|---|---|---|---|
| 4,672,893 A * | 6/1987 | Mammarella, Sr. | 101/170 |
| 4,903,579 A | 2/1990 | Hamilton | |
| 5,415,612 A | 5/1995 | Carlson | |
| 5,481,341 A | 1/1996 | Sypula | |
| 5,612,773 A | 3/1997 | Berkes | |
| 5,777,650 A | 7/1998 | Blank | |
| 5,813,961 A | 9/1998 | Buchwald | |
| 5,947,027 A | 9/1999 | Burgin | |
| 6,006,665 A | 12/1999 | Stuchlik | |
| 6,382,281 B1 * | 5/2002 | Mori et al. | 152/154.2 |
| 6,518,168 B1 | 2/2003 | Clem | |
| 6,544,156 B2 | 4/2003 | Anderson | |
| 6,923,921 B2 | 8/2005 | Flynn | |
| 6,939,279 B2 | 9/2005 | Shea | |
| 6,981,445 B2 | 1/2006 | Cracauer | |
| 7,117,790 B2 | 10/2006 | Kendale | |
| 2001/0013294 A1 * | 8/2001 | Bruno et al. | 101/327 |
| 2003/0047535 A1 | 3/2003 | Schueller | |
| 2003/0191000 A1 | 10/2003 | Park | |
| 2004/0080075 A1 | 4/2004 | Pekurovsky | |
| 2005/0193905 A1 | 9/2005 | Weiss | |
| 2007/0014920 A1 | 1/2007 | Syms | |
| 2007/0295073 A1 * | 12/2007 | Bougeard et al. | 73/146 |
| 2008/0202365 A1 * | 8/2008 | Schneider et al. | 101/287 |
| 2008/0271625 A1 * | 11/2008 | Chauhan et al. | 101/253 |
| 2008/0289524 A1 * | 11/2008 | Jongerius | 101/376 |
| 2008/0295717 A1 | 12/2008 | Vrotacoe | |
| 2009/0025595 A1 | 1/2009 | Mayers | |
| 2010/0258978 A1 | 10/2010 | Yamada | |
| 2011/0008577 A1 | 1/2011 | Miyake | |
| 2011/0226733 A1 | 9/2011 | Zu | |
| 2012/0082825 A1 | 4/2012 | Zu | |

FOREIGN PATENT DOCUMENTS

| | | |
|---|---|---|
| JP | 10-166550 | 6/1998 |
| JP | 2008-126440 | 6/2008 |
| JP | 2009-208317 | 9/2009 |
| JP | 2001-058352 | 3/2013 |
| WO | WO 03/099463 | 12/2003 |
| WO | WO 2006/043244 | 4/2006 |
| WO | WO 2008/091571 | 7/2008 |
| WO | WO 2009/085678 | 7/2009 |
| WO | WO 2009/107294 | 9/2009 |
| WO | WO 2009/110162 | 9/2009 |

OTHER PUBLICATIONS

Chakra, "A New Instrument for Automated Microcontact Printing with Stamp Load Adjustment", Review of Scientific Instruments, Jun. 2008, vol. 79, pp. 064102-1-064102-9.

Stagnaro, Adam. *Design and Development of a Roll-to-Roll Machine for Continuous High-Speed Microcontact Printing*. Master's thesis. Massachusetts Institute of Technology, 2008. Cambridge: MIT, 2008. Print.

International Search Report for PCT/US2010/060912, 3 pages.

\* cited by examiner

APPARATUS AND METHOD FOR MICROCONTACT PRINTING USING A PRESSURIZED ROLLER

CROSS REFERENCE TO RELATED APPLICATIONS

This application is a national stage filing under 35 U.S.C. 371 of PCT/US2010/060912, filed Dec. 17, 2010, which claims priority to U.S. Provisional Application No. 61/288,945, filed Dec. 22, 2009, the disclosure of which is incorporated by reference in its/their entirety herein.

TECHNICAL FIELD

The present disclosure relates to microcontact printing processes and devices used for patterning self assembling monolayers on a substrate.

BACKGROUND

Microcontact printing is a printing technique that can be used to generate patterns of functionalizing molecules that attach to a substrate surface, e.g., a coated substrate surface, via a chemical bond to form a patterned self assembled monolayer (SAM). A basic method for microcontact printing SAMs involves applying an ink containing functionalizing molecules to a relief-patterned elastomeric stamp (for example, a poly(dimethylsiloxane) (PDMS) stamp) and then contacting the inked stamp to a substrate surface, usually a metal or metal oxide surface, so that SAMs form in the regions of contact between the stamp and the substrate. Alternatively, the elastomeric stamp can be flat (that is, not containing a relief pattern) and the substrate surface can be relief patterned. Micropatterned organic and inorganic materials printed using microcontact printing methods can potentially provide unique electrical, optical, and/or biological properties to substrates such as metallized polymeric films.

SUMMARY

Some embodiments of the invention are directed to methods of microcontact printing. A method of microcontact printing involves providing a planar inked stamp comprising functionalizing molecules. A first surface of a substrate is oriented towards a surface of the inked stamp. Contact is made between the first surface of the substrate and the surface of the inked stamp as a pressurized roller rolls over a second surface of the substrate. The pressurized roller includes an inflatable bladder that is pressurized by a fluid. At least a portion of the functionalizing molecules are transferred from the surface of the planar inked stamp to the first surface of the substrate.

Another embodiment of the invention involves a microcontact printing apparatus. The apparatus includes a planar stamp and a roller including an inflatable bladder configured to be pressurized by a fluid. An actuator provides relative movement between the pressurized roller and the stamp in a direction substantially parallel to a surface of the stamp while the pressurized roller applies pressure to the planar stamp.

A microcontact printing roller having a longitudinal axis includes an inflatable bladder configured to be pressurized by a fluid. An outer surface of the roller is configured to have a height variation of less than 1 mm (millimeter) per 1 cm (centimeter) of width across a width of at least 5 cm along the longitudinal axis of the roller when the inflatable bladder is inflated to less than 20 psi (pounds per square inch).

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1A:
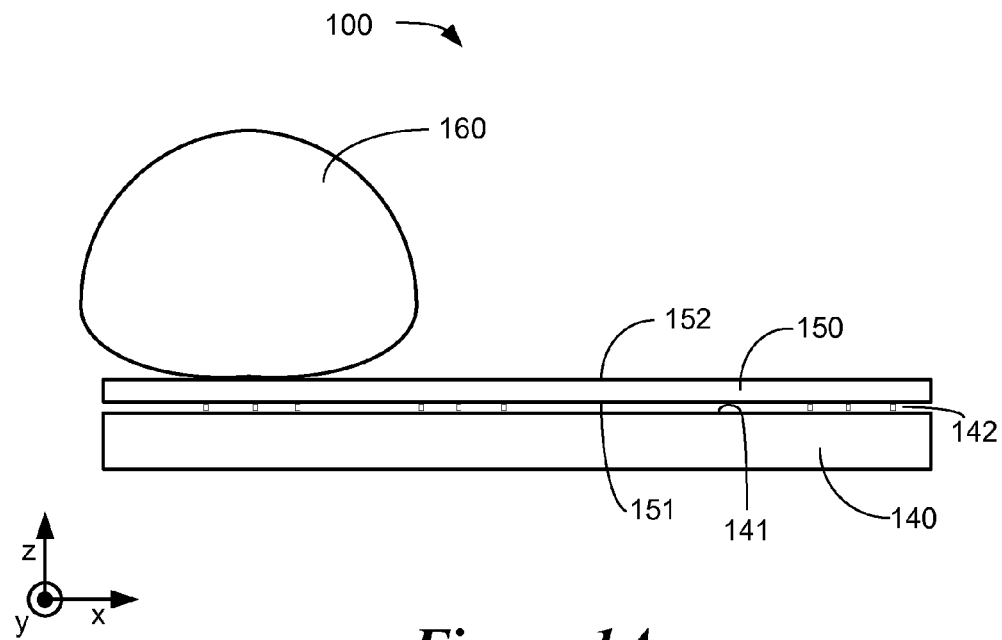
FIG. 1A illustrates a microcontact printing apparatus using a pressurized microcontact printing roller.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following description, references are made to the accompanying drawings which illustrate various embodiments of the invention. It is to be understood that other embodiments may be utilized, and structural and functional changes may be made to these embodiments without departing from the scope of the present invention.

Microcontact printing is a printing technique that involves transferring functionalizing molecules from a stamp to a substrate. The stamp or substrate include a relief patterned surface. The functionalizing molecules attach to the substrate surface via a chemical bond to form a self-assembled monolayer (SAM) in the desired pattern. The ability to transfer the functionalizing molecules from the stamp to the surface in the desired pattern without defects using microcontact printing depends on the local pressure applied to the substrate in the contact areas of the stamp.

Embodiments of the invention illustrate a pressurized roller for microcontact printing having an inflatable bladder that can be used in a microcontact printing apparatus. The pressurized roller can be used to exert a relatively low and substantially uniform pressure on the back surface of a substrate having a front surface that is in contact with the stamp. This approach has been shown to transfer a sufficient amount of functionalizing molecules in the desired pattern from the stamp to the front surface of the substrate without collapse into the unpatterned regions. Microcontact printing using a pressurized roller as described herein can be used to reliably pattern SAMs with sparse pattern geometries.

The pressurized rollers described herein are especially useful in combination with planar stamps. A "planar stamp" is an elastomeric material that transfers another material (e.g., molecules) from its printing surface to a substrate, wherein the printing surface has the overall shape of a plane. A printing surface of a stamp that is planar, and hence a stamp that is planar, may be "flat," which is to say that it does not have an intentional relief pattern. Alternatively, the printing surface of a stamp that is planar, and hence a stamp that is planar, may comprise a relief pattern, the relief pattern in some embodiments being microscopic. To further clarify, a planar stamp does not necessarily lack a relief pattern. Also to further clarify, a planar stamp is not necessarily flat.

Sparse pattern geometries present a particular challenge of stamp collapse (or roof collapse). By "stamp collapse," what is meant is that the stamp undesirably makes contact with the substrate in regions between raised features of the stamp. For example, for a flat substrate contacting a relief patterned stamp surface comprising raised regions and recessed regions, stamp collapse refers to undesirable contact between the substrate surface and the stamp surface in the recessed stamp surface regions. As another example, for a flat stamp contacting a relief patterned substrate surface comprising raised regions and recessed regions, stamp collapse refers to undesirable contact between the stamp surface and the substrate surface in the recessed substrate surface regions.

Sparse patterns for which the methods and apparatuses described herein are advantageous include spaced apart arrangements (e.g., arrays) of small pattern elements. Pattern elements include lines, dots, and polygons for example. A pattern element is describable in terms of its shape, orientation, and size. With respect to size, a pattern element is describable in terms of its minimum dimension, for example the width of a line element. The methods and apparatuses described herein are particularly advantageous for small pattern elements with minimum dimension of less than about 10 microns. In some embodiments of the methods and apparatuses, the minimum dimension of the pattern elements is less than about 5 microns.

Further regarding sparse patterns for which the approaches described herein are advantageous, the spacing between adjacent pattern elements can be large. Examples of the spacing between adjacent pattern elements include the spacing between parallel lines, the width of squares defined by linear pattern elements in the form of lines that define a square grid, and the spacing between opposite faces of hexagons defined by pattern elements in the form of lines that define a hexagonal network. For example, in various embodiments the spacing between adjacent pattern elements can be greater than about 50 microns, or greater than about 100 microns, or greater that about 200 microns, or greater than about 300 microns, or greater than about 400 microns, or even greater than about 500 microns.

The methods and apparatuses reported herein are particularly advantageous for microcontact printing with stamps having limited relief or with substrates having limited relief. More specifically, the methods and apparatuses reported herein are particularly advantageous for microcontact printing with stamps or substrates having relief of about 10 microns or less. The methods and apparatuses reported herein are also advantageous for microcontact printing with stamps or substrates having relief of about 5 microns or less.

Stamp collapse, as described above, can lead to defects in microcontact printed patterns. More specifically, undesirable contact between the stamp and the substrate can lead to undesirable transfer of functionalizing molecules to a substrate surface. In the case of a coated substrate, and where the printed pattern of functionalizing molecules is in turn used as a mask in an etching step to remove at least a portion of the coating, stamp collapse can lead undesirably to the presence of coating material on the substrate surface in regions complementary to the intended pattern after etching. In general, stamp collapse and the resulting artifacts thereof may result when stamping pressure is too high for a given pattern geometry.

As opposed to stamp collapse, other defects can result when stamping pressure is too low. For example, if stamping pressure is too low, the sufficiently intimate, continuous, complete contact that leads to effective transfer of functionalizing molecules from the stamp to the substrate may not take place. When the printed pattern of functionalizing molecules is intended to serve as an etch resist, the lack of sufficiently intimate, continuous, or complete contact between the stamp and the substrate, and the resulting deficiency in transfer of functionalizing molecules from the stamp to the substrate (e.g., to form completely a desired pattern of self-assembled monolayer), can lead to undesirable etching in regions of the pattern where etching was intended to be blocked. The undesirable etching can lead to undesirable thinning of an etched pattern of a coating material on a substrate. Or, the undesirable etching can lead to an undesirable void in the etched pattern of a coating materials on a substrate.

As just described, avoiding stamp collapse printing defects and avoiding printing defects related to inadequate contact between the stamp and the substrate are conflicting objectives in general, in terms of microcontact printing process parameters (e.g., printing pressure) and equipment design. For some patterns, relief levels, and materials (e.g., stamp and substrate), it is especially challenging to achieve these conflicting objectives. And importantly, it becomes dramatically more challenging to achieve the conflicting objectives above when microcontact printing over larger and larger area. The methods and apparatuses described herein have been found to address the competing challenges of avoiding stamp collapse defects and avoiding defects related to inadequate contact between the stamp and the substrate when microcontact printing over commercially relevant areas. The methods and apparatuses are useful for microcontact printing over, for example, areas greater than 100 square centimeters, greater than 200 square centimeters, or even greater than 1000 square centimeters.

Another microcontact printing defect is inaccurate feature size or shape (i.e., lack of pattern fidelity). This lack of fidelity in printing can result from a number of factors, including printing pressure and its associated effect of deforming the stamp or substrate. The methods and apparatuses described herein enhance pattern fidelity, especially for the pattern geometries that are also described.

The microcontact printing approaches described herein involve the use of a planar stamp and pressurized microcontact printing roller that does not include microcontact stamp elements disposed on the outer surface of the roller. The approaches described herein are distinguishable from microcontact printing that employs a deformable stamp roller including microcontact stamp elements disposed on the outer surface of the roller.

The use of a deformable stamp roller having microcontact pattern elements disposed on the surface to improve surface pressure during printing presents challenges with respect to preserving pattern fidelity. It will be appreciated by one of ordinary skill in the art that if a deformable stamp roller is pressurized, the precise pattern design becomes difficult to assure, due to distortion resulting from the pressure. In contrast, the methods and apparatuses of the present disclosure overcome this challenge. The present disclosure teaches methods and apparatuses that avoid deformation of the stamp.

FIGS. 1-11 illustrate various examples of a pressurized roller for microcontact printing including an inflatable bladder. The pressurized roller has a relatively soft outer surface. The hardness of a material may be characterized by the depth of indentation of the material for a given force. There are several scales for durometer (defined by Alfred F Shore) which are described in ASTM D2240. Each scale for durometer ranges from 0 to 100 with the hardness of the material increasing with numerical value. Although the methods and apparatuses described herein are not necessarily limited with respect to hardness of the outer surface, the outer surface of some of the pressurized rollers described herein have a durometer in a range of about 30 to about 80 Shore A.

The inflatable bladder can be any structure that is capable of being pressurized by a fluid to a pressure that exceeds the pressure outside the inflatable bladder, i.e., the ambient pressure. For example, the inflatable bladder may be pressurized in a range of about 1.5 to 2.5 psi, or may be pressurized in a range of about 1 to 3 psi, or may be pressurized to less than about 10 psi or less than about 20 psi.

Bladders may take the form of a hollow cylinder with a thin elastomer wall, capped or plugged on each end by supports, i.e., end caps, which may be made of rigid, solid, impermeable material (e.g., stainless steel disks). In some examples, the bladders may be supported by a core, such as a rigid cylindrical core. The inflatable bladder may be attached to the core or may fit over the core like a "sleeve." A sleeve-type inflatable bladder may not be permanently attached to the core, and may be removeable.

In some configurations, the inflatable bladder may have one or more elastomeric walls that are capable of maintaining a pressure differential between the interior of the bladder and the outer environment e.g., a wall or skin that encloses an interior volume and that expands upon pressurization. In some configurations, the wall may be substantially or completely impermeable to the pressurizing fluid. In some configurations, the inflatable bladder may not have a wall, but may comprise a foam, e.g., open cell foam, that is capable of being pressurized, at least for some amount of time.

Inflatable bladders, as the term is used herein, need not be capable of supporting a pressure differential indefinitely between the interior of the bladder and the external environment. On the contrary, it is within the scope of the present disclosure for the bladder material to leak some amount of fluid when pressurized. For example, if the bladder comprises an open cell foam, the fluid may leak through all or a portion of the outer surface of the foam. As another example, if the bladder comprises an elastomeric wall enclosing a pressurized interior volume, depending on the degree of permeability of the wall, the fluid may leak through a valve in the elastomeric wall and/or may leak directly through the wall, and/or may leak via another escape route.

The inflatable bladder may include one or more fluid input/output valves that allow fluid to enter and/or exit the bladder. The amount of fluid entering or exiting the inflatable bladder may be controlled to achieve and/or maintain a predetermined pressure in the inflatable bladder. For example, prior to a printing operation, the pressure in the inflatable bladder may be adjusted to a predetermined pressure. Additionally, or alternatively, during a printing operation, the pressure in the inflatable bladder may be adjusted to maintain a predetermined pressure. The adjustment of the pressure may involve actively delivering fluid to the bladder or allowing fluid to leak out of the inflatable bladder, or, in some configurations, actively removing fluid from the inflatable bladder to maintain the predetermined pressure. In some configurations, fluid may enter the inflatable bladder while fluid is simultaneously exiting the inflatable bladder.

In some configurations, the inflatable bladder comprises one or more elastomeric walls that expand as the inflatable bladder is pressurized. The walls of the bladder may have a thickness in a range of about 0.1 millimeter to about 3 millimeters, for example. In some configurations, the interior of the inflatable bladder within the elastomeric walls is substantially devoid of material other than the pressurizing fluid. In these implementations, the inflatable bladder does not include internal structural supports, e.g., rigid or flexible supports within the interior of the inflatable bladder.

In some configurations, the inflatable bladder may not include a thin elastomeric wall that encloses an interior volume of the pressurizing fluid, but instead comprises a foam, e.g., open cell foam, which is capable of being inflated to a pressure greater than the ambient pressure. In some configurations, the inflatable bladder may comprise one or more elastomeric walls with foam disposed in the interior of the inflatable bladder beneath or between the elastomeric walls.

During a microcontact printing operation, the pressurized roller is translated and/or rotated over the second surface of a substrate, moving the first surface of the substrate into contact with the stamp surface. Thus, the pressurized roller imparts a pressure to the stamp through the substrate. The pressure of the fluid in the inflatable bladder may be selected to achieve a pressure on the stamp that produces the desired microcontact printing performance. In some implementations, the pressure on the stamp is substantially equal to the pressure in the inflatable bladder. Substantially equal pressures between the pressure on the stamp and the pressure within the inflatable bladder can be achieved using inflatable bladders having thinner, softer materials for the inflatable bladder walls and/or foam.

FIG. 1A is a side view of an example of a microcontact printing apparatus 100 including a pressurized roller 160 in accordance with embodiments of the invention. FIG. 1A illustrates the microcontact printing apparatus during a microcontact printing operation. An elastomeric stamp 140 includes a relief pattern 142 on the surface 141 of the stamp 140. For example, in some applications, the relief pattern 142 may have an area on the surface 141 of the stamp 140 greater than about 100 mm$^2$. Functionalizing molecules are present on the raised features of the relief pattern 142. A substrate 150 is disposed between the stamp 140 and the pressurized roller 160 with a first surface 151 of the substrate 150 oriented toward the stamp surface 141 and a second surface 152 of the substrate 150 oriented toward the pressurized roller 160. As the pressurized roller 160 moves in the x direction across the second surface 152 of the substrate 150, the pressurized roller 160 imparts a pressure to the stamp surface 141 through the second surface 152 of the substrate. During the microcontact printing operation, functionalizing molecules from the relief pattern 142 on the stamp surface 141 are transferred to the first substrate surface 151. In alternate embodiments, the relief pattern may be disposed on the first surface of the substrate and the stamp may be flat, i.e., without a microcontact relief pattern. Examples are provided herein based on an apparatus that uses a relief patterned stamp, although it will be appreciated that these examples encompass the use of a relief-patterned substrate as well.

Figure 1B:
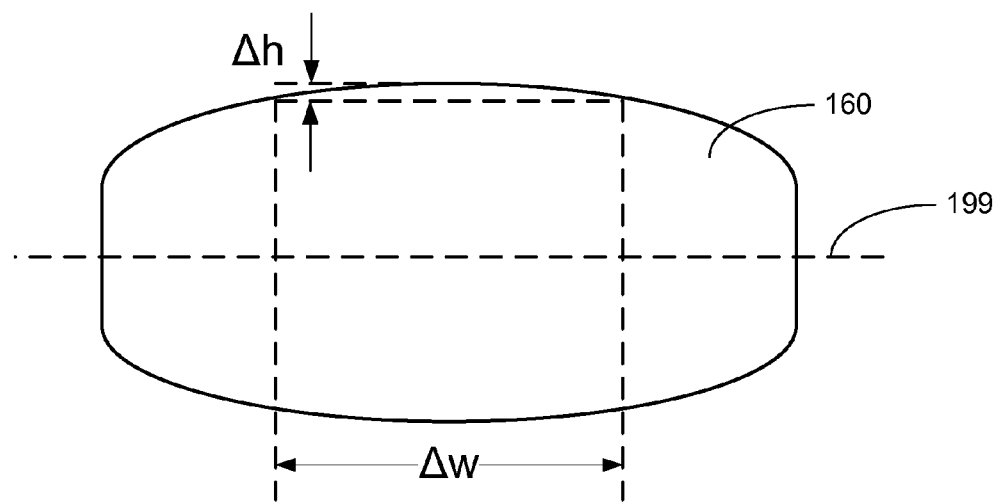
FIG. 1B is a plan view of the pressurized microcontact printing roller.

FIG. 1B is a plan view of the pressurized microcontact printing roller 160 showing the longitudinal variation in height of the roller 160. When pressurized, the roller 160 has a variation in height, $\Delta h$, of less than about 1 mm per cm of width over a width, $\Delta w$, of at least 5 cm along the longitudinal axis 199 of the roller 160.

Figure 2A:
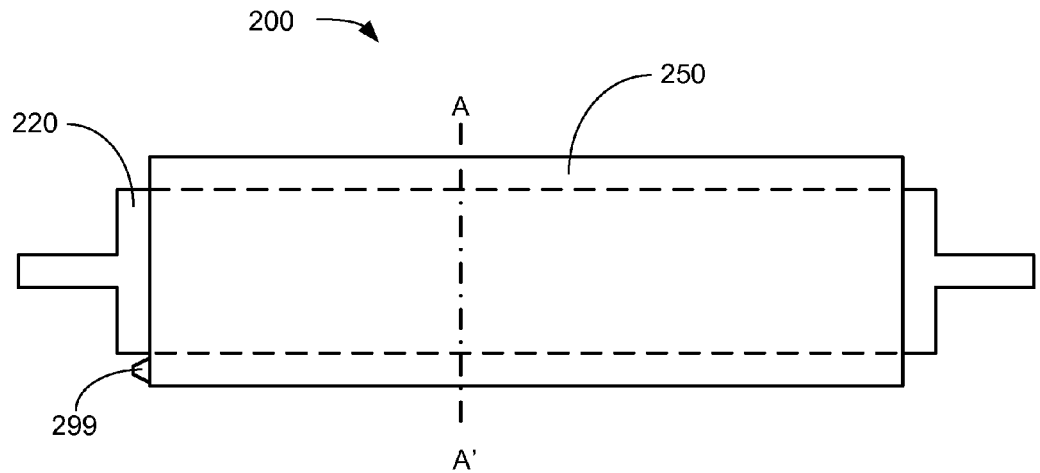
FIG. 2A depicts a plan view of a pressurized roller having an inner core.
Figure 2B:
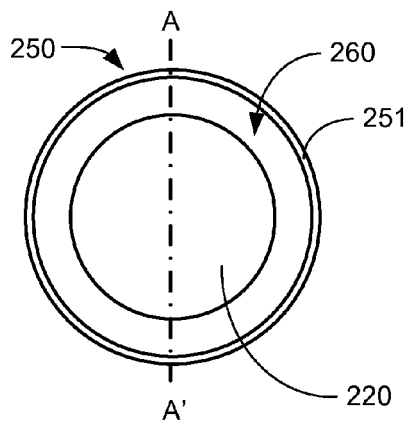
FIG. 2B illustrates a cross section of an inflatable bladder having an exterior wall that expands away from the core when the bladder is inflated.
Figure 2C:
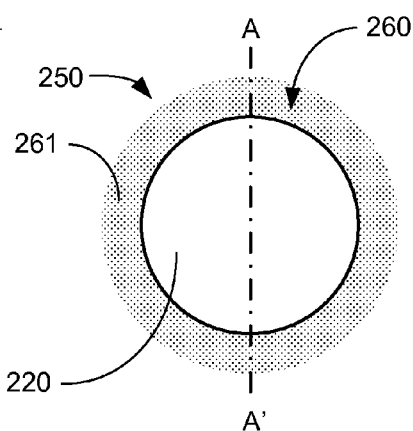
FIG. 2C illustrates a cross section of an inflatable bladder comprising an inflatable foam.
Figure 2D:
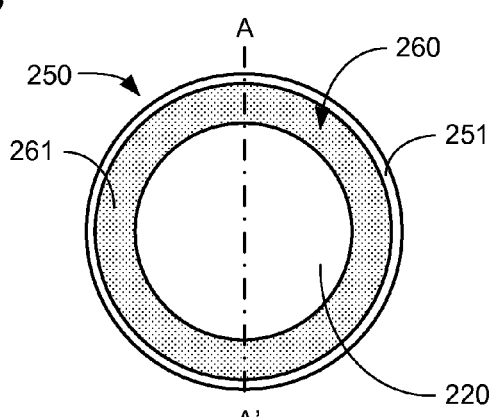
FIG. 2D illustrates a cross section of an inflatable bladder including an elastomeric wall disposed over a foam layer.

FIG. 2A depicts a plan view of an example of a pressurized roller 200 that is useful in a microcontact printing apparatus. The roller 200 includes a core 220 that may have any cross sectional shape, e.g., circle, ellipse, half circle or quarter circle, etc. In some embodiments, the core 220 comprises a substantially cylindrical core. The core 220 may be rigid or flexible, solid or hollow, and/or may be made out of metal, ceramic, plastic, and/or other suitable materials. The core 220 has the ability to rotate. For example, the core 220 may make one or more full 360° rotations while contacting the print substrate, or in some implementations, make less than a 360° rotation while contacting the print substrate. The pressurized roller 200 includes an inflatable bladder 250 which is capable of being inflated by a fluid, e.g., liquid or gas, to a pressure that is greater than the ambient pressure. The pressurizing fluid may be air. In this embodiment, the core 220 and the inflatable bladder 250 are coaxial. The inflatable bladder 250 may include one or more fluid input/output valves 299 that allow entry and/or exit of fluid to and/or from the interior 260 (as seen in FIGS. 2B-2D) of the inflatable bladder 250. The input/output valves 299 are arranged to pressurize the inflatable bladder and may be disposed on the roller core, on an elastomeric wall of the inflatable bladder, and/or, if the bladder comprises an open cell foam, the valve may be disposed on the foam. Some embodiments of the pressurized roller may include a valve located on the exterior surface of the inflatable bladder 250 as indicated in FIG. 2A. For embodiments of the pressurized roller having a inflatable bladder configured as a "sleeve", e.g., that fits over a hollow or solid core, or a pressurized roller having a hollow core, the input/output valves may be located so that access to the valves is achieved via the interior of the sleeve and/or through the hollow core.

As illustrated in the cross sectional diagrams of FIGS. 2B and 2D, the inflatable bladder 250 may have at least one wall 251 that retains the pressurizing fluid within the interior volume 260 of the inflatable bladder 250. The wall 251 may comprise an elastomeric material disposed along at least part of the length of the roller core 220. The elastomeric material may be any material that allows the inflatable bladder 250 to be pressurized to the desired pressures. In some configurations, the elastomeric material of the bladder wall comprises natural or synthetic rubbers, such buna rubber. Buna rubber includes butadiene as one of the monomers. Synthetic rubbers can involve the polymerization of a variety of monomers including isoprene (2-methyl-1,3-butadiene), 1,3-butadiene, chloroprene (2-chloro-1,3-butadiene), and isobutylene(methylpropene) with a small percentage of isoprene for crosslinking. In some configurations, the elastomeric material of the outer wall may comprise a foam, e.g., a closed cell foam, or other material.

The inflatable bladder 250 may have only one elastomeric wall 251 which is sealed, for example, against the core 220 (or other structural component) to retain pressure within the inflatable bladder 250. When pressurized, fluid is present in the interior 260 of the inflatable bladder 250 between the core 220 and the elastomeric wall. In some implementations, the interior 260 of the inflatable bladder 250 is substantially empty of materials other than the pressurizing fluid. In some implementations, the use of only the pressurizing fluid within the bladder interior without rigid or semi-rigid supporting structures achieves the desired microcontact printing performance.

In some implementations, as illustrated by FIGS. 2C and 2D, the inflatable bladder 250 may comprise a foam 261, e.g., an expandable open cell foam, within the interior 260 of the inflatable bladder 250. The foam 261 may be used with or without the outer wall 251. FIG. 2D illustrates the use of foam 261 within the interior 260 of the inflatable bladder 250 with an outer wall 251. FIG. 2C illustrates the use of foam 261 within the interior 260 of the inflatable bladder 250 with no outer wall. In configurations that do not include an outer wall, as shown in FIG. 2C, the foam 261 may be an open cell foam that is capable of being inflated by the fluid to a pressure greater than the ambient pressure.

The material used for the foam may vary widely depending on the intended printing application and the resiliency required in the tape construction, but typically, polyethylene, polyurethane, silicone, or synthetic rubbers, such as ethylene-propylene diene or block copolymers, such as those based on styrene, may be used. The foams, which are preferably crosslinked, may be closed cell or open cell materials having a density of about 2 to about 50 pounds per cubic foot. The inflatable bladder (foam and/or elastomeric wall versions) may be pressurized to a pressure less than about 20 psi or less than about 10 psi, for example. In some implementations the inflatable bladder may be pressurized to between about 1 to 3 psi, or between about 1.5 to 2.5 psi.

Figure 3A:
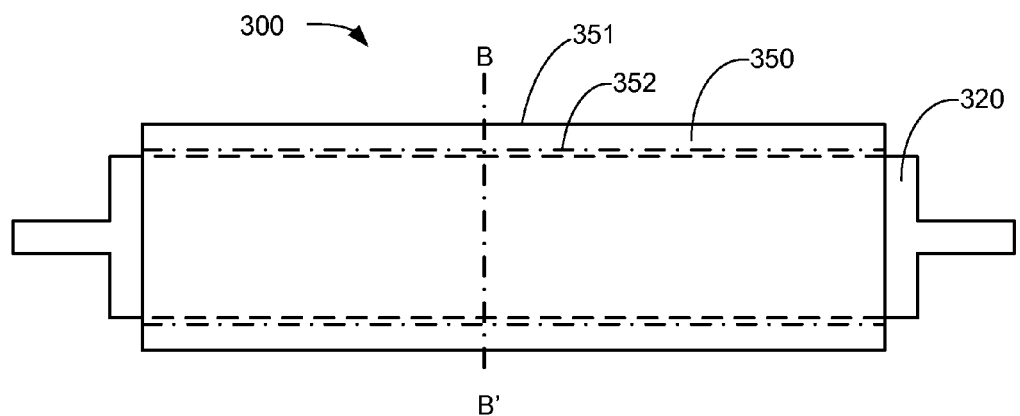
FIG. 3A is a plan view of a pressurized roller comprising an inflatable bladder that has inner and outer elastomeric walls.
Figure 3B:
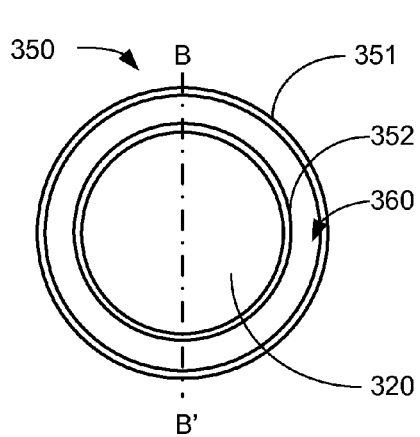
FIG. 3B is a cross section of an inflatable bladder having a inner and outer elastomeric walls and an interior volume that contains the pressurizing fluid.
Figure 3C:
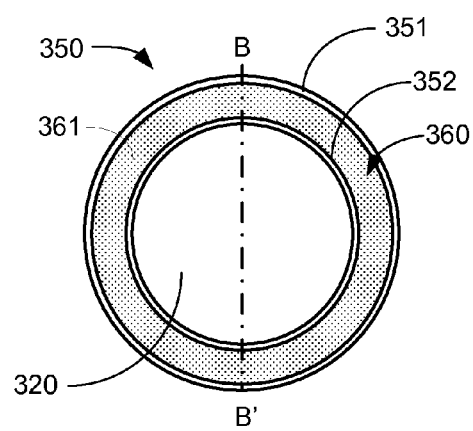
FIG. 3C is a cross section of an inflatable bladder having a inner and outer elastomeric walls and foam disposed between the inner and outer walls.

The pressurized roller may include an inflatable bladder that has more than one longitudinal elastomeric wall, as illustrated in the plan view of FIG. 3A and the cross sectional views of FIGS. 3B and 3C. The pressurized roller 300 includes a core 320 and an inflatable bladder 350 including an outer elastomeric wall 351 and an inner elastomeric wall 352. In this configuration, the inflatable bladder 350 may form a removeable "sleeve" that fits over the core 320 and can be removed from the core 320 if desired. The interior 360 of the inflatable bladder 350 (as seen in FIGS. 3B and 3C) contains the pressurizing fluid. In some embodiments, as illustrated in FIG. 3B, the interior 360 of the inflatable bladder 350 may be substantially devoid of material other than the pressurizing fluid. In some embodiments, illustrated in FIG. 3C, the interior 360 of the inflatable bladder 350 may comprise foam 361.

In some configurations, the pressurized roller may include one or more layers in addition to the inflatable bladder. The additional layers may be inflatable or un-inflatable. The additional layers may comprise a compliant material, such as foam or rubber. For example, the additional layers may be arranged between the core and the inflatable bladder. Additionally, or alternatively, the pressurized roller may include one or more additional layers arranged over the outer surface of the inflatable bladder.

For example, the additional layers may be used in configurations where it is desirable to reduce and/or to some extent even out variations in height in the material below the additional layer. The material used for the additional layer and/or the outer wall of the inflatable bladder may be selected so that an outer surface of the pressurized roller has a particular durometer value. For example, the outer surface of the pressurized roller may have a durometer in a range of about 30 to 80 Shore A.

Figure 4A:
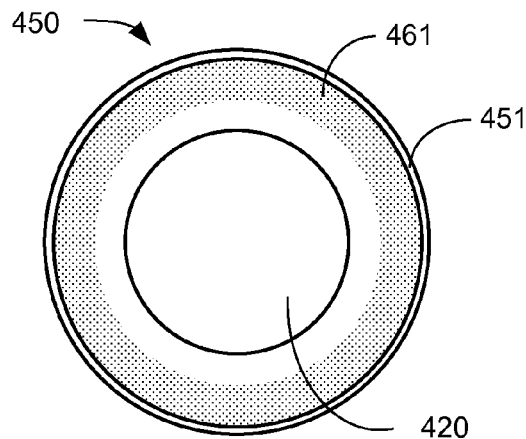
FIG. 4A is a cross section of an inflatable bladder having an outer elastomeric wall and a foam layer, wherein the elastomeric wall and the foam layer expand away from the roller core when the bladder is inflated.
Figure 4B:
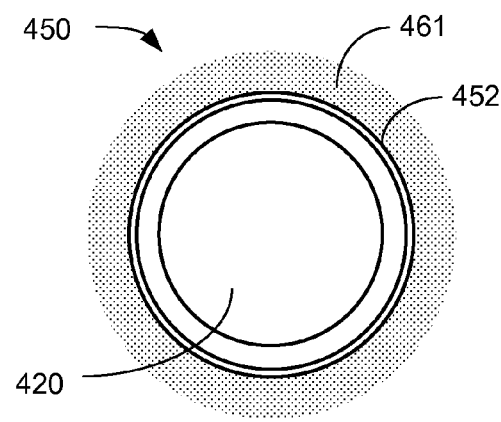
FIG. 4B is a cross section illustrating an inflatable bladder having an inner elastomeric wall and a foam layer, wherein the elastomeric wall and the foam layer expand away from the roller core when the bladder is inflated
Figure 4C:
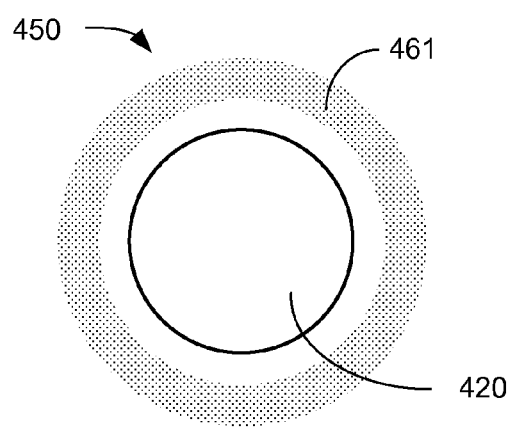
FIG. 4C depicts a cross section of an inflatable bladder having a foam layer that expands away from the roller core when the bladder is inflated.

In some configurations, the inflatable bladder may include a foam layer that expands away from the core when inflated, as illustrated in the cross sectional views of FIGS. 4A-4C. FIG. 4A illustrates a cross section of an inflatable bladder 450 that includes foam layer 461 covered by an outer wall 451. When the inflatable bladder 450 is pressurized, the foam 461 and the outer wall 451 expand away from the core 420. In this embodiment, if an open cell foam is used, the pressurizing fluid may permeate and inflate the foam. A closed cell foam or other material which is not penetrable by the pressurizing fluid may alternatively be used.

FIG. 4B depicts a cross sectional view of an inflatable bladder 450 that includes foam layer 461 that covers an inner wall 452. The foam layer 461 may comprise an open and/or closed cell foam. For the configuration illustrated in FIG. 4B, when the inflatable bladder is pressurized, the foam 461 and the inner wall 452 expand away from the core 420.

FIG. 4C is a cross sectional view of an inflatable bladder 450 that includes an open cell foam 461 without an inner or outer wall. In this case, the foam 461 expands away from the core 420 and the pressurizing fluid may leak from the outer surface of the foam 461.

Figure 5A:
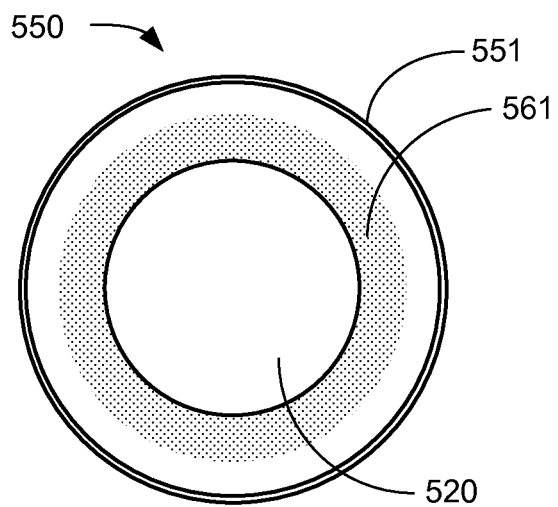
FIG. 5A is a cross section of an inflatable bladder having a foam layer disposed over the roller core and an outer elastomeric wall that expands away from the foam layer when the bladder is inflated.
Figure 5B:
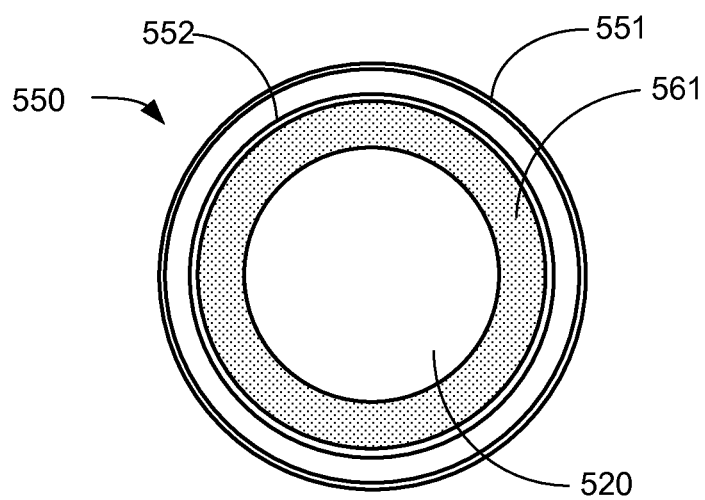
FIG. 5B is a cross section of an inflatable bladder with a foam layer disposed over the roller core, an inner elastomeric wall, and an outer elastomeric wall that expands away from the foam layer and the inner elastomeric wall when the bladder is inflated.

Some variations of the inflatable bladder include a foam layer, which may or may not be inflatable, adjacent the core and one or more bladder walls disposed over the inner foam layer, as depicted in the cross sectional diagrams of FIGS. 5A and 5B. FIG. 5A depicts a foam layer 561 adjacent the bladder core 520. The inflatable bladder 550 of FIG. 5A includes an outer wall 551 that expands away from the core and the foam when the bladder is pressurized. FIG. 5B illustrates a foam layer 561 adjacent the bladder core 520. The inflatable bladder 550 includes an inner wall 552 adjacent the foam. The inflatable bladder 550 of FIG. 5B also includes an outer wall 551 that expands away from the inner wall 552, the foam 561, and the core 520 when the bladder is pressurized.

Figure 6A:
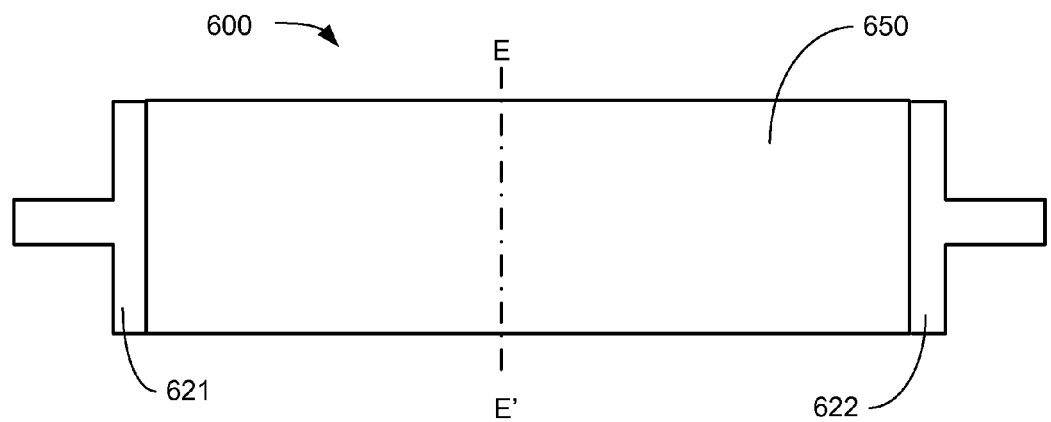
FIG. 6A is a plan view of a coreless pressurized roller having an inflatable bladder supported by end.

In some configurations, the pressurized roller may not include a core. Examples of coreless variations of the pressurized roller are depicted in the plan view of FIG. 6A and the cross sectional views of the inflatable bladders of FIGS. 6B-6E. FIG. 6A shows a coreless roller 600 comprising an inflatable bladder 650 between end caps 621, 622.

Figure 6B:
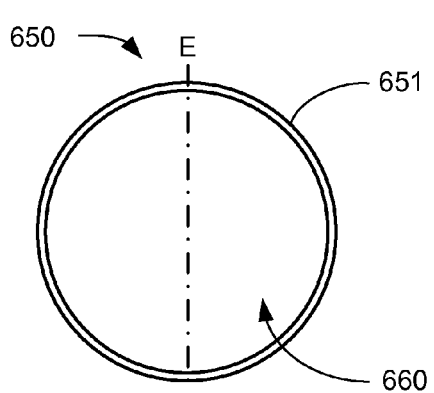
FIG. 6B is a cross sectional view of a coreless pressurized roller comprising an inflatable bladder with an outer elastomeric wall.

In one version, depicted in the cross section of FIG. 6B, the inflatable bladder 650 may have an elastomeric wall 651 that expands when the pressurizing fluid is present within the interior 660 of the inflatable bladder 650.

Figure 6C:
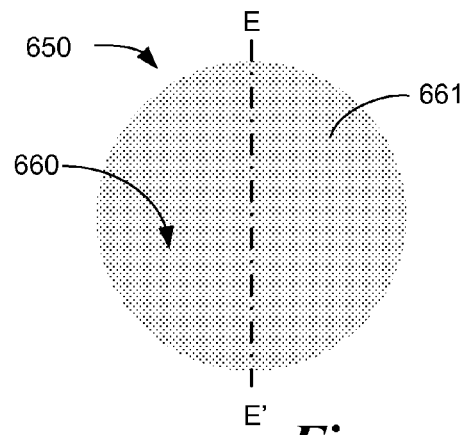
FIG. 6C is a cross sectional view of a coreless pressurized roller comprising an inflatable bladder of an expandable foam.

In another version, depicted in the cross section of FIG. 6C, a foam 661 is present within the interior 660 of the inflatable bladder 650. In the configuration of FIG. 6C, the inflatable bladder 650 does not include a bladder wall, but the foam 661 is an open cell foam that is capable of being pressurized to exceed the ambient pressure. The pressurizing fluid may leak from the outer surface of the foam 661.

Figure 6D:
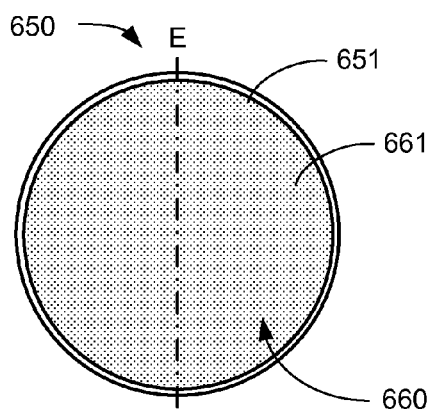
FIG. 6D is a cross sectional view of a coreless pressurized roller comprising an inflatable bladder having an expandable foam and an outer elastomeric wall.

As depicted in the cross section of FIG. 6D, in some implementations of a coreless roller, both an outer wall 651 and an inflatable foam 661 within the interior of the inflatable bladder 650 are used.

Figure 6E:
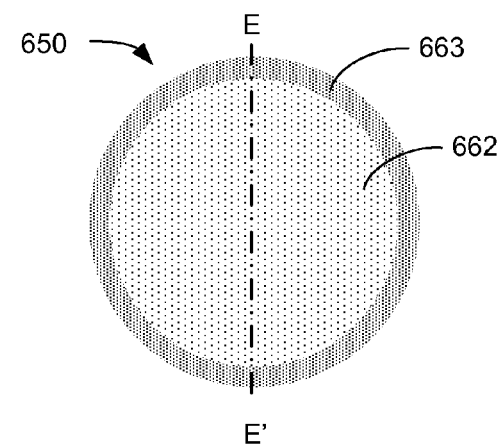
FIG. 6E is a cross sectional view of a coreless pressurized roller comprising an inflatable bladder having a gradient expandable foam.

As shown in FIG. 6E, some embodiments involve a gradient foam that comprises an open cell foam 662 near the core and transitions to a more closed cell foam 663 near the external surface of the inflatable bladder 650. The transition may be a step transition or may be a gradual transition. In these embodiments, the outer surface of the bladder 650 may or may not be substantially impermeable by the pressurizing fluid. In other words, the pressurizing fluid may leak from the outer surface of the inflatable bladder having the gradient foam, but may leak more slowly than an open cell foam that does not transition to a more closed cell version.

In general, the pressurized roller may be any length and the core and/or inflatable bladder may have any diameter. In some embodiments, the diameter of the pressurized roller is less than about 3 inches. If a core is used, the core may have a diameter of less than about 2.5 inches with the inflatable bladder having a diameter of less than 1 inch.

Figure 7A:
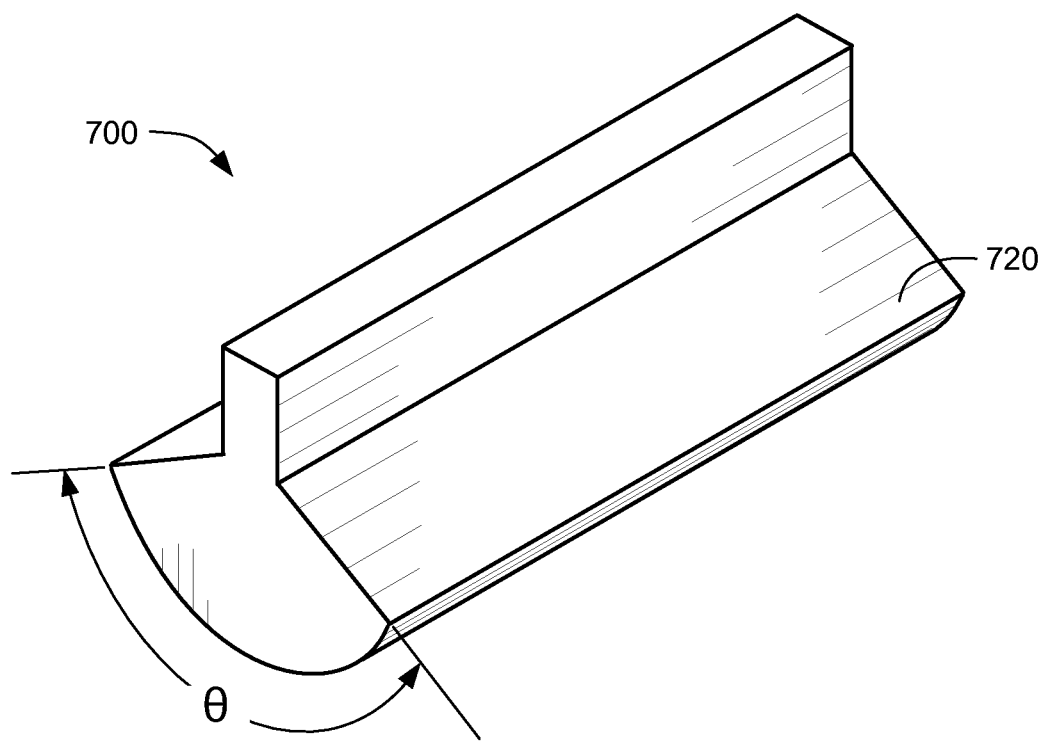
FIGS. 7A and 7B illustrate a pressurized roller having a non-cylindrical core.
Figure 7B:
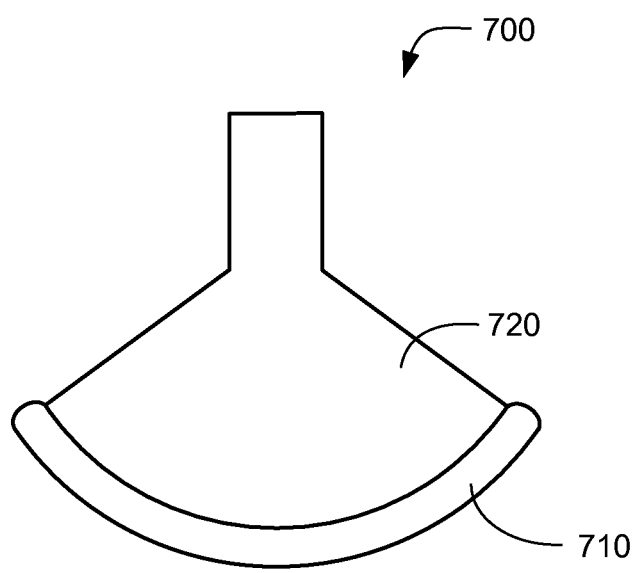

The core cross section may be some portion of a circle, ellipse, or other shape. FIG. 7A illustrates a non-cylindrical roller core 720 without the inflatable bladder present. For example, the roller core 720 may be designed to rotate around an angle equal to or less than θ while in contact with the substrate during a microcontact printing operation. FIG. 7B is a cross section that illustrates the pressurized roller 700 including the inflatable bladder 710 and the core 720. The pressurized roller 700 may have multiple layers in addition to the inflatable bladder 710, and have comparable structures to those illustrated in FIGS. 2-6, for example. The inflatable bladder 710 may comprise one or more elastomeric walls and/or one or more layers of foam. The inflatable bladder 710 may be attached to the core 720 by any suitable means, e.g., using an adhesive, etc.

Figure 8:
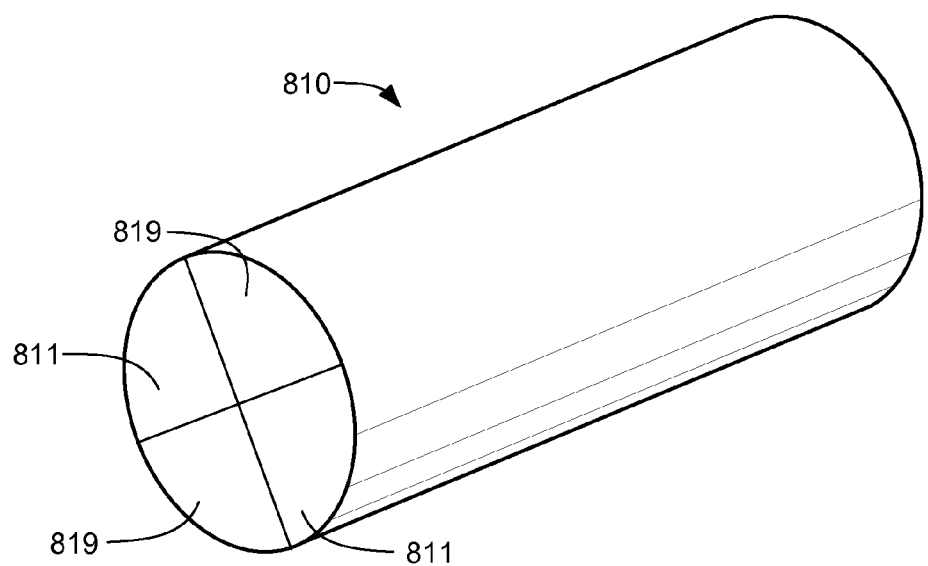
FIG. 8 is an example of a pressurized roller that includes longitudinal inflatable portions and non-inflatable portions that are interspersed along the core.
Figure 9:
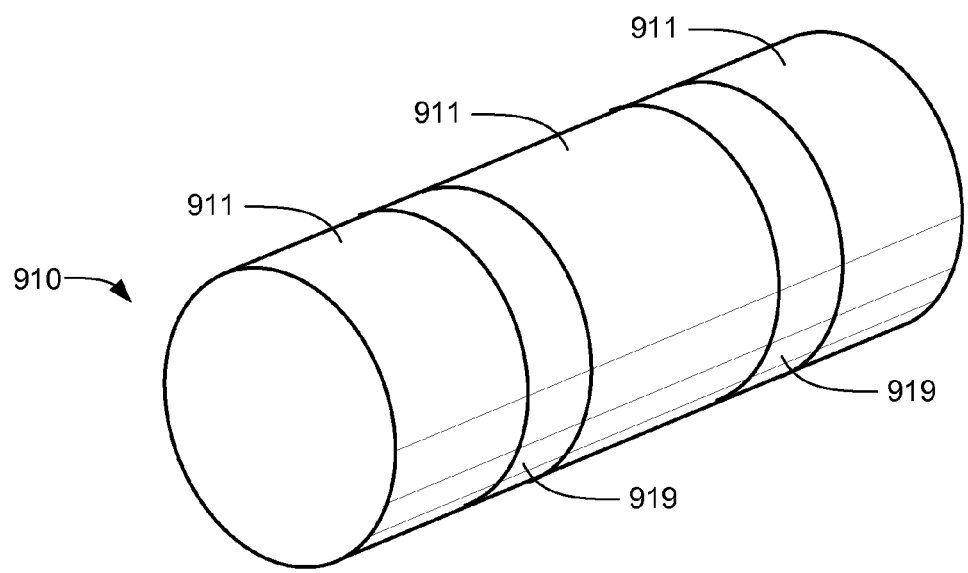
FIG. 9 is an example of a pressurized roller that includes circumferential inflatable portions and non-inflatable portions that are interspersed around the core.

As illustrated in FIGS. 8 and 9, the pressurized roller 810, 910 may include one or more inflatable portions 811, 911 and one or more non-inflatable portions 819, 919. Longitudinal inflatable portions 811 and non-inflatable portions 819 may be interspersed as illustrated in FIG. 8, or circumferential inflatable portions 911 and non-inflatable portions 919 may be interspersed as illustrated in FIG. 9.

Figure 10A:
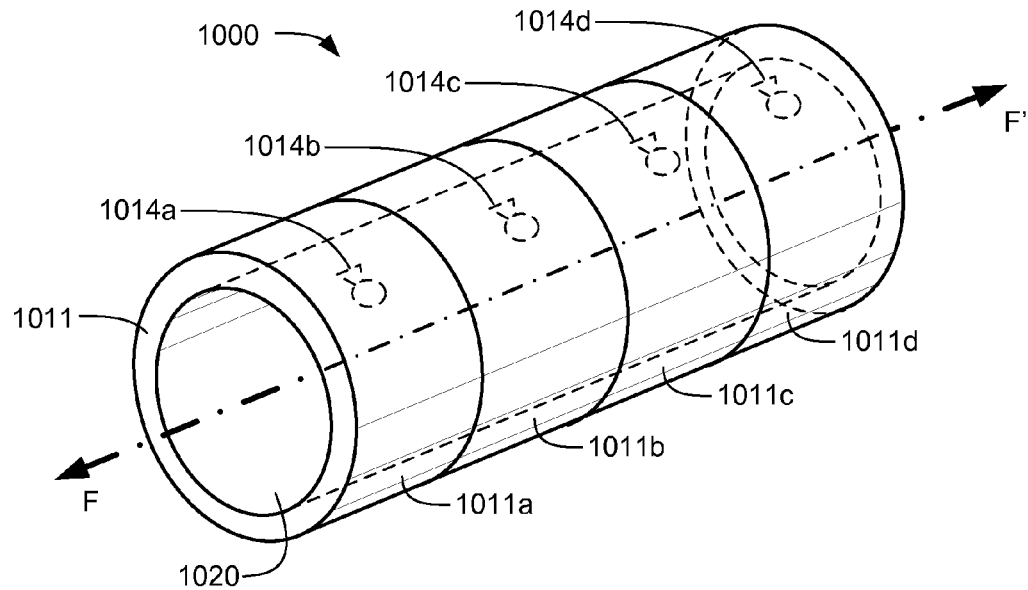
FIG. 10A illustrates an example of a pressurized roller that includes a segmented inflatable bladder.

As illustrated in FIG. 10A, the pressurized roller 1000 may comprise a segmented inflatable bladder 1011 having multiple segments 1011a-d that can be inflated to substantially the same pressure or to different pressures. Pressurization valves 1014a-d, configured to allow individual pressurization of each of the inflatable segments 1011a-d, may be positioned within a hollow core 1020, for example. A segmented inflatable bladder 1011 as depicted in FIG. 10A may be used reduce longitudinal variation inflatable bladder 1011.

Figure 11:
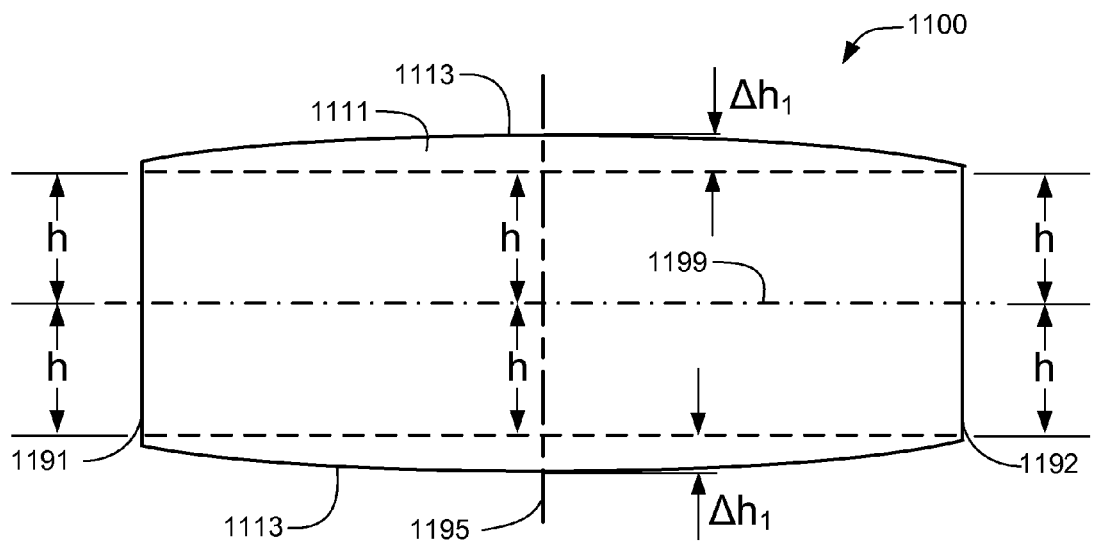
FIG. 11 illustrates a longitudinal height variation of an un-segmented inflatable bladder.

As illustrated in the cross section of a pressurized roller 1100 illustrated in FIG. 11, an exemplary un-segmented inflatable bladder 1111 has a variation in height of $\Delta h_1$ along the central axis 1199 of the pressurized roller 1100. At the ends 1191, 1192 of the roller 1100 the outer surface 1113 of the inflatable bladder 1111 has a height h above and below the central axis 1199 of the roller 1100. However, at the longitudinal center 1195 of the roller 1100, the inflatable bladder 1111 has a height above the axis 1199 of $h+\Delta h_1$. The longitudinal variation in height can cause undesirable variations in microcontact printing results. Depending on the design and selection of materials, the variation in height $\Delta h_1$ along the central axis can be minimized for an un-segmented inflatable bladder.

Figure 10B:
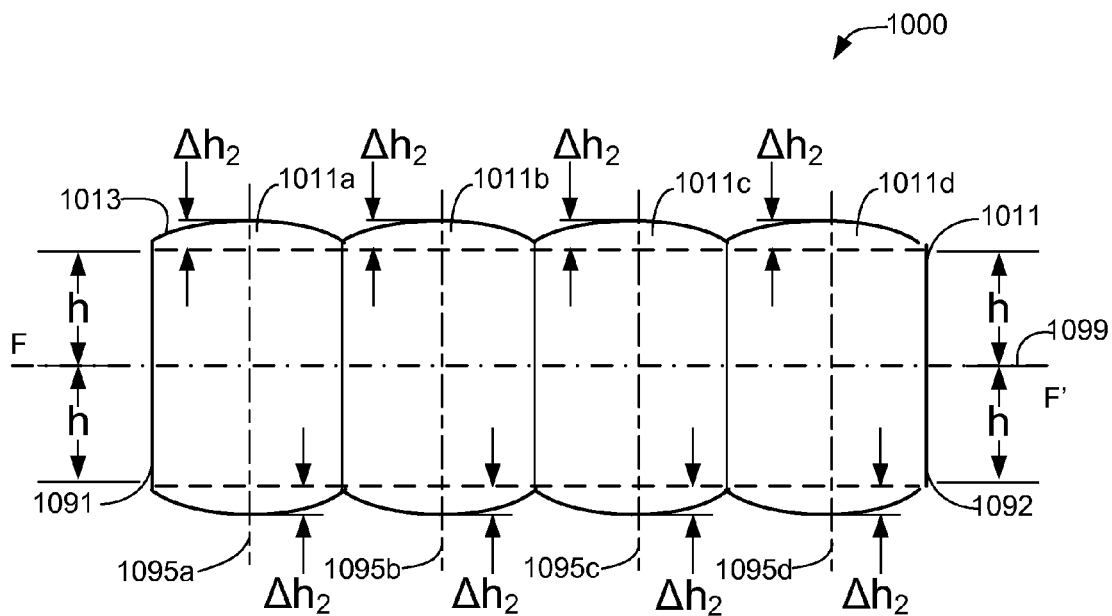
FIG. 10B is a cross-section of a pressurized roller that includes a segmented inflatable bladder.

A segmented inflatable bladder reduces the longitudinal variation in height above the central axis, as compared with some un-segmented inflatable bladders. FIG. 10B is a cross section of roller 1000 (previously shown in a 3 dimensional view in FIG. 10A) along axis F-F'. Inflatable bladder 1011 comprises multiple inflatable segments 1011a-1011d. At the ends 1091, 1092 of the pressurized roller 1000, the outer surface 1013 of the inflatable bladder 1011 has height h above and below the axis 1099 of the roller 1000. At the longitudinal centers 1095a-1095d of the bladder segments 1011a-1011d, the height of the inflatable bladder 1011 above the axis 1099 reaches a maximum height of $h+\Delta h_2$, where $\Delta h_2$ in FIG. 10B is less than $\Delta h_1$ in FIG. 11. Thus, a segmented bladder can reduce the overall longitudinal variation of pressurized rollers when compared to some pressurized rollers having a an un-segmented bladder made of material having the same elasticity.

Figure 12:
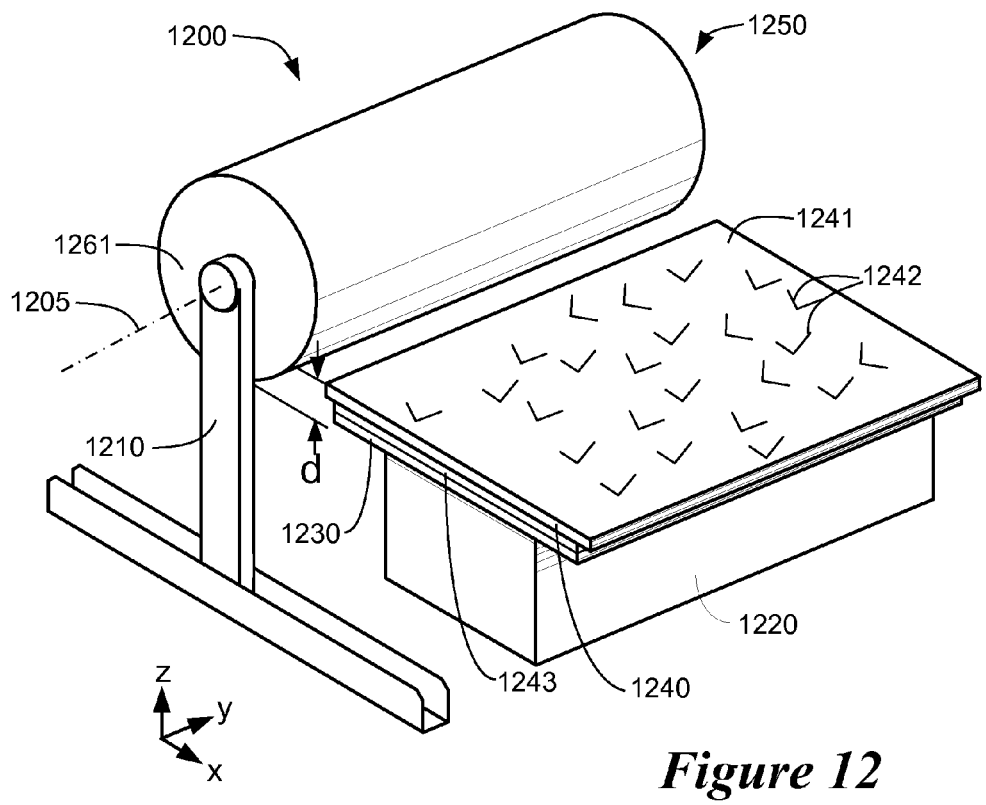
FIG. 12 is an illustration of a portion of a microcontact printing apparatus.

FIG. 12 is an illustration of a portion of a microcontact printing apparatus 1200. The microcontact printing apparatus 1200 includes a planar elastomeric stamp 1240 having a relief pattern 1242 disposed on a surface 1241 of the stamp 1240. Alternatively, in embodiments in which the substrate is patterned with a relief pattern, the stamp 1240 may not include a pattern.

The relief pattern 1242 may have pattern elements having minimum and maximum spacings and relief heights as previously described. For example, the relief pattern 1242 may raised features (raised pattern elements) with a minimum dimension of less than about 10 microns, or even less than about 5 microns. The spacing between adjacent raised pattern elements can be greater than about 50 microns, or greater than about 100 microns, or greater that about 200 microns, or greater than about 300 microns, or greater than about 400 microns, or even greater than about 500 microns. The relief of the relief pattern may be about 10 of less or may be about 5 microns or less, for example. The relief pattern features may have widths down to about 5 microns, or may be less than 5 microns, e.g., down to about 2 microns, for example.

The stamp 1240 is mounted to a rigid backing plate 1243 that may be porous. In the case where the backing plate 1243 is porous, the apparatus 1200 may include an ink reservoir 1230 that holds an "ink" of functionalizing molecules. The ink reservoir 1230 is fluidically coupled to the stamp 1240 to allow functionalizing molecules stored within the reservoir 1230 to move by passive or active mechanisms, e.g., by wicking, gravity, pumping and/or other mechanisms, from the reservoir 1230 to the stamp surface 1241. In the configuration illustrated in FIG. 12, the functionalizing molecules are transported from the ink reservoir 1230, through the backing plate 1243 and to the patterned surface 1241 of the stamp 1240.

Useful elastomers for forming the stamp 1240 and for other stamps include silicones, polyurethanes, ethylene propylene diene M-class (EPDM) rubbers, as well as the range of existing commercially available flexographic printing plate materials (for example, commercially available from E. I. du Pont de Nemours and Company, Wilmington, Del., under the trade name Cyrel™). The stamp can be made from a composite material (for example, one of the aforementioned elastomers combined with a woven or non-woven fibrous reinforcement).

Polydimethylsiloxane (PDMS) is particularly useful as a stamp material, as it is elastomeric and has a low surface energy (which makes it easy to remove the stamp from most substrates). PDMS is also commercially available. A useful commercially available formulation is Sylgard™ 184 PDMS (Dow Corning, Midland, Mich.). PDMS stamps can be formed, for example, by dispensing an uncrosslinked PDMS polymer into or against a patterned mold, followed by curing.

The master tool for molding the elastomeric stamps can be formed using photolithography techniques known in the art. The elastomeric stamp can be molded against the master tool by applying uncured PDMS to the master tool and then curing.

The stamp 1240 is disposed on a stamp support 1220 which supports the stamp 1240 and which may be adjustable in x, y and/or z directions. The stamp support 1220 may also allow tilting the stamp 1240 and/or the ink reservoir 1230 around the x, y and/or z axes.

The microcontact printing apparatus includes a pressurized roller 1250, as previously described. In the illustrated embodiment of FIG. 12, the pressurized roller 1250 includes a core 1270 and an inflatable bladder 1261. The pressurized roller 1250 is supported by one or more roller supports 1210 that support the roller 1250 on one or both sides of the roller 1250. The roller support 1210 provides for movement of the roller 1250 in x, y, and/or z directions and/or allows the roller 1250 to rotate around axis 1205. The roller support 1210 may also be configured to allow the roller 1250 to be tilted around one or more axes.

The microcontact printing operation involves providing relative movement of the pressurized roller 1250 and the stamp 1240 along the x axis. For example, in one implementation, the pressurized roller is translated along the x axis while the roller 1250 rotates. The pressure applied by the pressurized roller 1250 normal to the patterned surface 1241 of the stamp 1240 may be adjusted by adjusting the fluid pressure in the inflatable bladder 1261 and/or by adjusting the perpendicular offset, d, between the bottom surface of the inflated bladder 1261 and the patterned surface 1241 of the stamp 1240. The distance d may be adjusted by adjusting the stamp support 1220 to move the stamp 1240 in the + or −z direction and/or by adjusting the roller supports 1210 to move the roller 1250 in the + or −z direction, for example.

Figure 13:
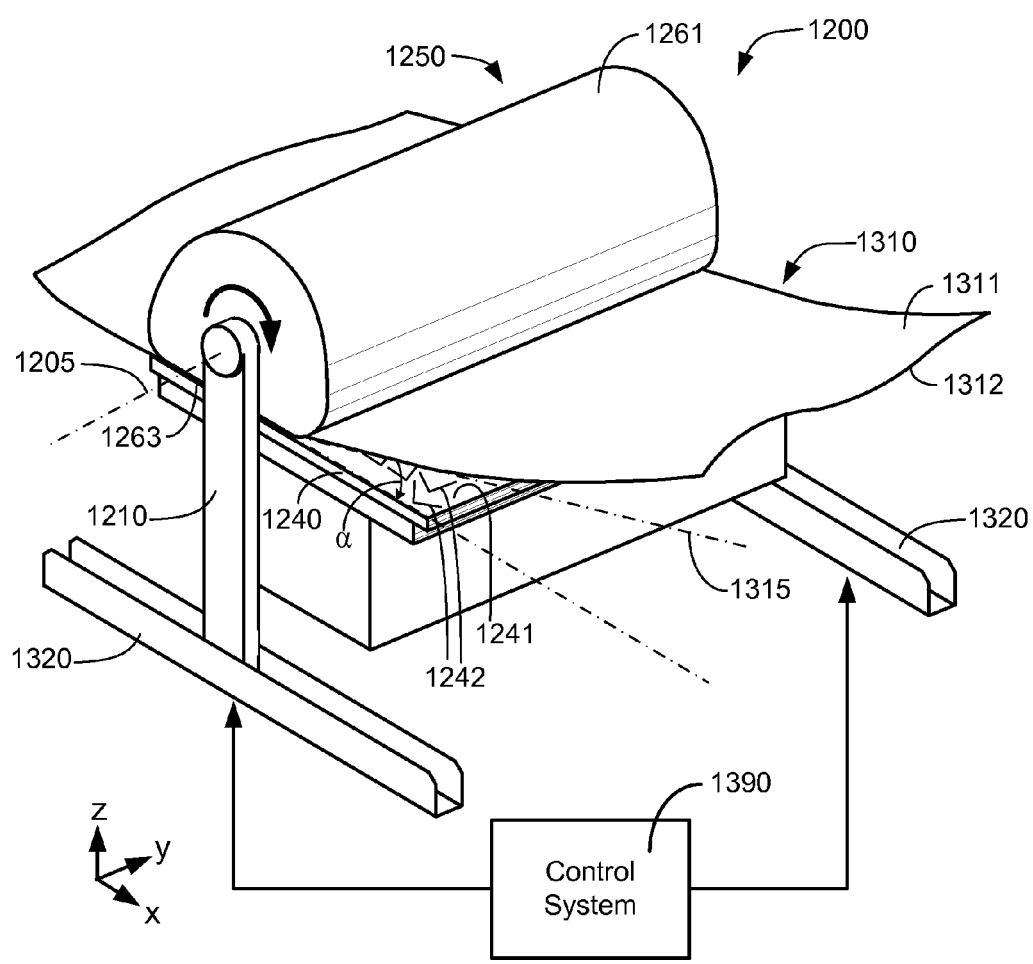
FIG. 13 provides another view of a microcontact printing apparatus at a point in time when the pressurized roller is moving over a substrate.

FIG. 13 provides another view of the microcontact printing apparatus 1200 at a moment in time in which the roller 1250 is moving over the surface 1241 of the stamp 1240. A substrate 1310 is disposed between the roller 1250 and the stamp surface 1241 with a first substrate surface 1312 oriented toward the stamp 1240 and a second substrate surface 1311 oriented toward the roller 1250. For example, the substrate 1310 may be an elongated, flexible substrate capable of being processed in a roll to roll manner.

The roller 1250 is supported by roller support 1210 which is moveable in the x direction in tracks 1320. As the roller 1250 moves along the x axis, it also rotates around axis 1205. During this translational and rotational movement, the roller 1250 applies a pressure to the second surface 1311 of the substrate 1310 and the applied pressure is transferred to the stamp surface 1241. During the translation and rotation of the pressurized roller 1250, the first surface of the substrate 1312 contacts the raised portions of the relief pattern on the stamp surface 1241. As used in this context, "contacts" encompasses direct contact as well as a small separation such as an ink thickness.

Functionalizing molecules are transferred from the stamp surface 1241 to the first substrate surface 1312. The portion 1263 of the roller 1250 that exerts pressure on the substrate 1310 and the stamp 1240 is deflected by an amount d, as illustrated in FIG. 12. The pressure in the inflatable bladder 1261 may be selected to achieve a pressure on the stamp 1240 that produces the desired microcontact printing performance. In some implementations, the fluid pressure within the inflatable bladder 1261 is about equal to the pressure exerted by the pressurized roller 1250 on the stamp 1240. For example, if the pressure within the inflatable bladder 1261 is about 3 psi, the pressure exerted by the roller 1250 on the stamp 1240 (indirectly through the substrate 1310) is also about 3 psi.

During the microcontact printing process, the substrate 1310 may be initially oriented at an angle, α, with respect to the stamp surface 1241 so that a portion of the substrate 1311 is not initially in contact with the stamp surface 1241. For example, the substrate 1310 may be oriented towards the surface 1241 of the stamp 1240 such that a tangent 1315 to a portion of the first substrate surface 1312 that is not in contact with the stamp surface 1241 but that is adjacent to a point of contact between the stamp surface 1241 and the first substrate surface 1312 makes an angle, α, with the plane of the stamp surface 1241. The intersection between the portion of the substrate 1310 that is in contact with the stamp surface 1241 and the portion of the substrate 1310 that is not in contact with the stamp surface 1241 forms an initial contact front between the first surface of the substrate 1312 and the surface of the stamp 1241.

The initial contact front has a relatively small area when compared to the area to be patterned. As the roller 1250 rolls over the second surface 1311 of the substrate 1310, the initial contact area expands as a propagating region of contact between the substrate 1310 and the stamp 1241. Propagation of the region of contact from a relatively small initial contact front reduces void defects.

The duration of contact between the stamp surface 1241 and the first substrate surface 1312 can vary, depending upon factors including, for example, the concentration of the functionalizing molecules and/or the pressure applied to the stamp 1240. In some embodiments, the print time can be less than about 1 minute, less than about 30 seconds, less than about 10 seconds or even less than about 5 seconds.

During the microcontact printing operation, functionalizing molecules disposed on the relief pattern 1242 of the stamp 1240 are transferred to the first surface 1312 of the substrate 1310. Once they are transferred to the substrate 1310, the functionalizing molecules assemble into a SAM having a pattern corresponding to that of the stamp pattern 1242. In alternative embodiments, the inked surface of the stamp 1240 may be essentially flat, with the substrate 1310 comprising the relief pattern. Such "reverse" microcontact printing process is described for example in U.S. Pat. No. 6,518,168 (Clem et al.).

In some configurations of the micro contract printing process, some or all of the process is manually controlled. In some configurations, various processes of the microcontact printing process may be automatically controlled by movement control system 1390. The control system 1390 may include, for example, motors, sensors, microprocessors and/or other mechanical and electronic components to provide automatic control of the microcontact printing process. For example, the microcontact printing process described above may be used in a step and repeat process, wherein the substrate is repetitively moved to expose successive portions of the substrate to the microcontact printing process described above. The substrate 1310 may be an elongated substrate with sufficient flexibility to be unwound from a roll prior to microcontact printing and/or wound onto a roll after microcontact printing. The movement control system 1390 may automatically control one or more of the position of the substrate, the speed of substrate movement, the alignment of the substrate and the stamp and/or roller, the angle, a, at the contact front, the distance, d, between the roller and the stamp, the translation and/or rotation of the roller, the pressure in the inflatable bladder, and/or other microcontact printing process parameters.

For example, a microcontact printing apparatus may include a movement control system configured to provide synchronous movement between the substrate, roller, and/or stamp and/or to repetitively align the substrate with the stamp and/or roller during a step and repeat process. The control system may use one or more motors, e.g., stepper motors and/or servo motors, to move various components of the microcontact printing apparatus. A micro-processor based control unit may provide feedback signals to control the speed of movement and/or the positions of various microcontact printing components based on sensed inputs.

In some embodiments, encoders may be arranged on the shafts of the motors, or other rotational elements, to sense the rotational movement of the motors. The sensed movement of the motors can be used to determine the position of the substrate, e.g., the x-direction (down web) position of the substrate, the position of the stamp, and/or the rotational or translational position of the roller. One or more motors may be attached to the roller core (or roller end caps) to provide automatic rotation of the pressurized roller which may be synchronized with the movement of the substrate, for example. Fiducials may be disposed on the substrate and/or stamp to provide for alignment of the substrate, stamp and/or roller in the x-axis (down web) direction and/or in the y-axis (cross web) direction. Alternatively or additionally, the microcontact printing apparatus may include one or more sensors configured to sense the substrate edge to determine the y-axis position of the substrate and/or to align the y-axis position of the substrate with various microcontact printing components.

Figure 14:
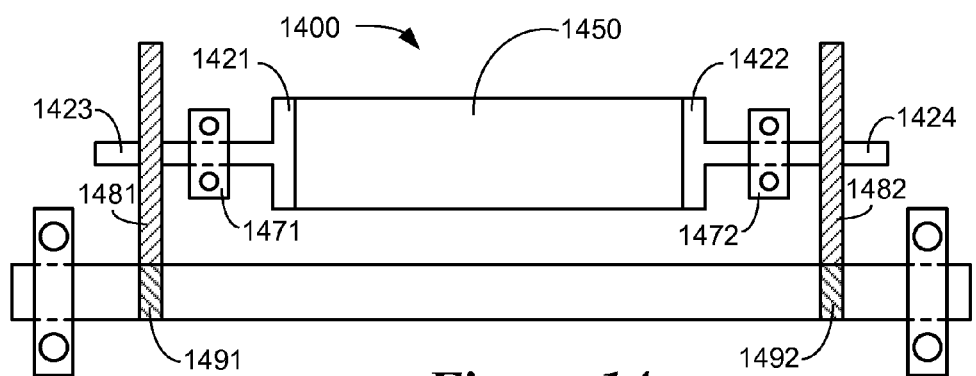
FIG. 14 is a diagram illustrating a pressurized roller and a motorized apparatus configured to rotate the pressurized roller.

FIG. 14 illustrates a plan view of pressurized roller 1400 coupled to a synchronization apparatus configured to synchronize the rotation of the each end of the pressurized roller 1400. Synchronizing the movement of the ends of the pressurized roller is particularly useful if the pressurized roller does not include a rigid core and/or could flex during the printing process. FIG. 14 illustrates an inflatable bladder 1450 disposed between end caps 1421, 1422. The end caps 1421, 1422 include shafts 1423, 1424 that are firmly supported at bearings 1471, 1472 and are free to rotate. The synchronization apparatus includes meshed gears 1481, 1491 and 1482, 1492 that can be driven manually or by a motor to rotate the shafts in synchrony.

Suitable substrates for the methods and apparatuses described herein include flexible polymer films. Rigid substrates may also be used, for example glass or semiconductor wafer substrates (e.g., silicon). Examples of suitable polymer films include polyethylene terephthalate, polyethylene napthalate, polycarbonate, cellulose triacetate, and polyimide. The methods and apparatuses described herein are particularly effective for avoiding the aforementioned printing defects when very flexible substrates are used. For example, the methods and apparatuses described herein are particularly useful for substrates, for example polymer film substrates, that have thickness between approximately 10 micrometers and approximately 260 micrometers, more preferably between approximately 25 micrometers and approximately 185 micrometers, and most preferably between approximately 50 micrometers and approximately 130 micrometers.

Useful substrates include coated substrates. In combination with the aforementioned base substrate materials, useful coatings include for example metal coatings and metal oxide coatings. Useful metal coatings include, for example, gold, silver, platinum, copper, palladium or combinations thereof. Useful metal oxide coatings include, for example, indium tin oxide, silicon dioxide, and silicate glass. The coatings are not limited with respect to thickness.

As previously described, microcontact printing produces a single layer of molecules attached, for example, by a chemical bond, to a substrate surface. The molecules may adopt a preferred orientation with respect to the substrate surface and even with respect to each other. The functionalizing molecules that are used to form the SAMs are referred to herein as ink or are part of an ink solution or ink composition. In some implementations, the ink forms a self-assembled monolayer (SAM) on the substrate which serves as a resist for selectively etching metal and metalized substrates, to form electrically conductive patterns.

Various molecules that form a self-assembled monolayer (SAM) are known such as organosulfur compounds, organosilanes and organophosphonic acids. Organosulfur compounds include for example alkyl thiols, dialkyl disulfides, dialkyl sulfides, alkyl xanthates, dithiophosphates, and dialkylthiocarbamates. The molecules are characterized by a tail group or groups attached to a sulfur atom, wherein the tail group or groups have between 14 and 20 atoms along their backbone, preferably 16, 17, or 18 atoms. The atoms along the backbone are preferably carbon atoms.

Preferably the ink solution comprises alkyl thiols such as, for example, linear alkyl thiols:

where n is the number of methylene units and X is the end group of the alkyl chain (for example, X=—$CH_3$, —OH, —COOH, —$NH_2$, or the like). Preferably, X=—$CH_3$ and n=15, 16, or 17, corresponding to chain lengths of 16, 17, or 18, respectively. Other useful chain lengths include 19 and 20. For linear molecules bearing a sulfur-containing head group for attachment to a metal, the chain length is determined as the number of atoms along the linear arrangement of bonded atoms between and including the atom that is bonded to the sulfur atom and final carbon atom in the linear arrangement. The monolayer-forming molecule may comprise other end groups or be branched (e.g. with side groups) provided that the molecule is suitable to form a self-assembled monolayer that functions as an etch resist. The SAM-forming molecules may also be partially fluorinated or perfluorinated, for example as described in U.S. Provisional Patent Application Ser. No. 61/121605 (Zu et al.)

Printing can involve a displacement reaction that results in removal or modification of an atom or functional group in the SAM-forming molecules (for example, conversion of a thiol (R-SH compound) to a thiolate (R-S-M) monolayer when the monolayer is formed on a metal (M), for example silver or gold). Thus, the resulting printed pattern can comprise compounds or molecules that are chemically different from the molecules of the ink composition.

Optionally, the ink compositions can comprise at least one solvent. Suitable solvents for use in the ink compositions include alcohols, ketones, aromatic compounds, heterocyclic compounds, fluorinated solvents, and the like, and combinations thereof. Other useful solvents include dimethylformamide, acetonitrile, dimethylacetamide, dimethylsulfoxide, ethyl acetate, tetrahydrofuran (THF), methyl t-butyl ether (MTBE), and the like, and combinations thereof.

The solvent of the ink composition can be selected so as to evaporate relatively rapidly from the stamp surface, which is helpful for achieving a relatively uniform distribution of the SAM forming molecules on or within the stamp with a minimum of time and application of forced air. The solvents are chosen such that the solvent does not excessively swell the (e.g. PDMS) stamp.

In some embodiments, an ink suitable for microcontact printing may be a solution comprising one or more dissolved organosulfur compounds and a solvent, the solvent having (i) a boiling point between about 50° C. and about 100° C., (ii) a relative polarity of less than about 0.4, and (iii) a poly(dimethylsiloxane) swelling ratio of less than about 1.25. Each organosulfur compound has 10 or more carbon atoms, and the organosulfur compound(s) are present in a total concentration of at least about 3 mM. The ink solution contains essentially no solid particles of the organosulfur compounds or solid particles derived from the organosulfur compounds. Preferably, each organosulfur compound is a thiol compound. More preferably, each is an alkyl thiol. Additional details of this type of ink are described in PCT Application Publication WO 2009/085678 A1 (Zu et al.).

Microcontact printing inks including perfluoropolyether organosulfur compounds exhibit relatively greater resistance to tri-iodide etchants for gold (and thereby relatively greater etching selectivity) than the resistance exhibited by SAMs formed from alkylthiols. The perfluoropolyether organosulfur compounds (especially those that are amide-linked) can be used to form patterning compositions that can be microcontact printed with relatively high fidelity on gold surfaces to yield patterned masks that are "tri-iodide etchant compatible." Such compatibility with tri-iodide etchants can enable chemical etching of the patterned substrates to be carried out with enhanced process speed and therefore enhanced industrial utility, relative to processes using conventional SAMs and/or conventional chemical etchants (for example, cyanide/oxygen-, ferrocyanide/ferricyanide-, and thiourea-based etchant systems).

Perfluoropolyether organosulfur compounds useful as functionalizing molecules include those that comprise at least one perfluoropolyether segment and at least one organosulfur group. Useful organosulfur groups include those comprising sulfur-containing moieties such as mercapto (-SH), dithio (—S—S—), oxythiocarbonylthio (—O—C(═S)S—), thio (—S—) (such moieties being characteristic of thiol, disulfide, xanthate, and sulfide (including thioether) compounds, respectively), and the like, and combinations thereof.

The ink may comprise a perfluoropolyether organosulfur compound that includes perfluoropolyether thiol compounds. Such compounds can be prepared by various different known methods including those described in U.S. Pat. No. 6,923,921 (Flynn et al.). Perfluoropolyether thiol compounds can be oxidized by known methods to provide perfluoropolyether disulfide compounds (for example, in the form of dithio-linked dimers of the perfluoropolyether thiol compounds, which can be symmetrical or asymmetrical). Perfluoropolyether sulfides and perfluoropolyether xanthates can be prepared by known methods.

Suitable perfluoropolyether organosulfur compounds include those perfluoropolyether thiols, xanthates, and sulfides that contain only one perfluoropolyether segment, and those perfluoropolyether disulfides that contain only two perfluoropolyether segments (the preferred disulfides being, for example, dimers of the preferred thiols). The perfluoropolyether segment(s) can be linear, branched, cyclic (preferably, alicyclic), or a combination thereof. Preferably, the perfluoropolyether segment is monovalent or divalent and/or the perfluoropolyether segment comprises at least one divalent hexafluoropropyleneoxy group (—CF(CF$_3$)—CF$_2$O—). Preferred perfluoropolyether segments include F[CF(CF$_3$)CF$_2$O]$_a$CF(CF$_3$)—, wherein a has an average value of about 4 to about 20, and —CF(CF$_3$)(OCF$_2$CF(CF$_3$))$_b$OCF$_2$CF$_2$CF$_2$CF$_2$O(CF(CF$_3$)CF$_2$O)$_c$CF(CF$_3$)—, wherein b+c has an average value of about 4 to about 15. Such perfluoropolyether segments can be obtained through the oligomerization of hexafluoropropylene oxide and can be preferred because of their relatively benign environmental properties.

A class of useful perfluoropolyether thiol compounds is that which can be represented by the following general formula (I):

(I)

wherein R$_f$ is a monovalent or divalent perfluoropolyether group; Q is a divalent, trivalent, or tetravalent organic linking group; x is an integer of 1 to 3 (preferably, 1); and y is an integer of 1 or 2 (preferably, 1). Further preferences for R$_f$ and Q include those described below in reference to Formulas II and III.

Suitable perfluoropolyether organosulfur compounds for use as functionalizing molecules include those that are amide-linked. Such amide-linked compounds include perfluoropolyether thiol compounds that comprise a perfluoropolyether segment (as described above), at least one mercapto group (-SH), and at least one intervening or interposed divalent carbonylimino moiety (—C(═O)—N(R)—, wherein R is hydrogen or alkyl; preferably, the alkyl group has from one to about four carbon atoms). The divalent carbonylimino moiety can be directly or indirectly (preferably, directly) bonded through its carbon atom to the perfluoropolyether segment and indirectly bonded through its nitrogen atom to the mercapto group. Alternatively, the divalent carbonylimino moiety can be indirectly bonded through its carbon atom to the mercapto group and indirectly bonded through its nitrogen atom to the perfluoropolyether segment. Preferably, the carbonylimino moiety is —C(═O)—NH— (that is, R is hydrogen).

A class of useful amide-linked perfluoropolyether thiol compounds is that which can be represented by the following general formula (II):

(II)

wherein R$_f$ is a monovalent or divalent perfluoropolyether group; R is hydrogen or alkyl; Q is a divalent, trivalent, or tetravalent organic linking group; x is an integer of 1 to 3 (preferably, 1); and y is an integer of 1 or 2 (preferably, 1). Preferably, R is hydrogen or an alkyl group having from one to about four carbon atoms (more preferably, hydrogen); and/or Q is a divalent group selected from alkylene, cycloalkylene, arylene, heteroalkylene, and combinations thereof (preferably, alkylene, heteroalkylene, and combinations thereof; more preferably, alkylene), optionally further comprising at least one divalent group selected from carbonyl, carbonyloxy, carbonylthio, carbonylimino, sulfonamido, and combinations thereof (preferably, carbonyl, carbonyloxy, carbonylimino, carbonylthio, and combinations thereof; more preferably, carbonyloxy, carbonylimino, and combinations thereof), and optionally being substituted with at least one moiety selected from alkyl, cycloalkyl, aryl, halo, and combinations thereof.

Preferably, Q has at least about 2 carbon atoms and/or less than or equal to about 30 carbon atoms (more preferably, less than or equal to about 20 carbon atoms; even more preferably, less than or equal to about 10 carbon atoms; most preferably, less than or equal to about 6 carbon atoms). Particularly preferred linking groups, Q, include —CH$_2$CH$_2$—, —CH$_2$CH$_2$CH$_2$—[NH—C(═O)]—CH$_2$CH$_2$CH$_2$—, —CH$_2$CH$_2$CH$_2$—[N(CH$_3$)—C(═O)]—CH$_2$CH$_2$CH$_2$—, —CH$_2$CH$_2$CH$_2$—[N(CH$_3$)—C(═O)]—CH$_2$CH$_2$CH$_2$—S—C(═O)—CH$_2$CH$_2$CH$_2$—, —CH$_2$CH$_2$—[NH—C(═O)]—CH$_2$CH$_2$CH$_2$—, —CH$_2$CH$_2$—[O—C(═O)]—CH$_2$CH$_2$—, —(CH$_2$CH$_2$O)$_2$—[C(═O)]—CH$_2$CH$_2$—, and combinations thereof.

R$_f$ can be linear, branched, cyclic, or a combination thereof and can be saturated or unsaturated. Representative examples of useful R$_f$ groups include, but are not limited to, those that have perfluorinated repeating units selected from —(C$_p$F$_{2p}$)—, —(C$_p$F$_{2p}$O)—, —(CF(Z))—, —(CF(Z)O)—, —(CF(Z)C$_p$F$_{2p}$O)—, —(C$_p$F$_{2p}$CF(Z)O)—, —(CF$_2$CF(Z)O)—, and combinations thereof, wherein p is an integer of 1 to about 10 (preferably, 1 to about 8; more preferably, 1 to about 6; even more preferably, 1 to about 4; most preferably, 1 to about 3); Z is selected from perfluoroalkyl, perfluoroether, perfluoropolyether, and perfluoroalkoxy groups that are linear, branched, cyclic, or a combination thereof and that have less than or equal to about 12 carbon atoms (preferably, less than or equal to about 10 carbon atoms; more preferably, less than or equal to about 8 carbon atoms; even more preferably, less than or equal to about 6 carbon atoms; still more preferably, less than or equal to about 4 carbon atoms; most preferably, less than or equal to about 3 carbon atoms) and/or less than or equal to about 4 oxygen atoms (preferably, less than or equal to about 3 oxygen atoms; more preferably, less than or equal to about 2 oxygen atoms; most preferably, zero or one oxygen atom). In these perfluoropolyether structures, different repeating units can be combined in a block, alternating, or random arrangement to form the $R_f$ group.

When $R_f$ is monovalent, its terminal group can be $(C_pF_{2p+1})-$ or $(C_pF_{2p+1}O)-$, for example, wherein p is as defined above. Representative examples of useful monovalent $R_f$ groups include, but are not limited to, $C_3F_7O(CF(CF_3)CF_2O)_nCF(CF_3)-$, $C_3F_7O(CF_2CF_2CF_2O)_nCF_2CF_2-$, $CF_3O(C_2F_4O)_nCF_2-$, $CF_3O(CF_2O)_n(C_2F_4O)_qCF_2-$ and $F(CF_2)_3O(C_4F_8O)_q(CF_2)_3-$ (wherein n has an average value of 0 to about 50, about 1 to about 50, about 3 to about 30, about 3 to about 15, or about 3 to about 10; and q has an average value of 0 to about 50, about 3 to about 30, about 3 to about 15, or about 3 to about 10).

Representative examples of useful divalent $R_f$ groups include, but are not limited to, $-CF_2O(CF_2O)_n(C_2F_4O)_qCF_2-$, $-CF_2O(C_2F_4O)_qCF_2-$, $-(CF_2)_3O(C_4F_8O)_q(CF_2)_3-$, and $-CF(CF_3)(OCF_2CF(CF_3))_sOC_nF_{2n}O(CF(CF_3)CF_2O)_qCF(CF_3)-$ (wherein n and q are as defined above; s has an average value of 0 to about 50, about 1 to about 50, about 3 to about 30, about 3 to about 15, or about 3 to about 10; the sum of q and s (that is, q+s) has an average value of 0 to about 50 or about 4 to about 40; the sum of q and n (that is, q+n) is greater than 0; and t is an integer of about 2 to about 6).

A class of amide-linked perfluoropolyether thiol compounds for use in microcontact printing is that which can be represented by the following general formula (III):

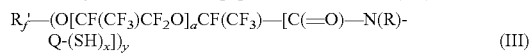

wherein $R_f'$ is a linear or branched perfluoroalkyl or perfluoroalkylene group (preferably, having from 1 to about 6 carbon atoms); a has an average value of about 4 to about 20; and R, Q, x, and y are as defined above in reference to general formula II.

Representative examples of useful amide-linked perfluoropolyether thiol compounds include the following, wherein a has an average value of about 4 to about 20 and b+c has an average value of about 4 to about 15:

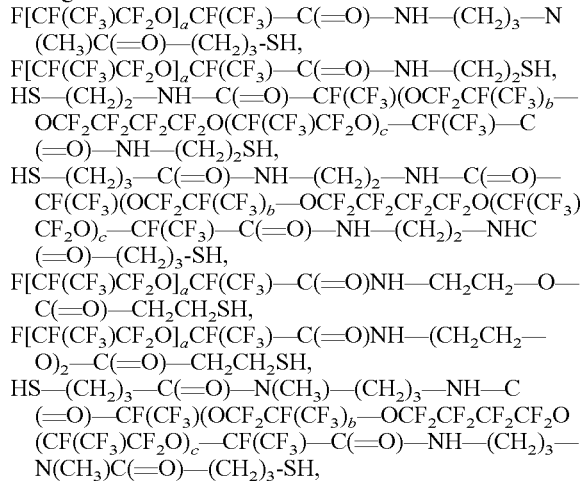

and the like, and combinations thereof. Perfluoropolyether organosulfur compounds and processes for making such compounds are further described in U.S. Provisional Patent Application Ser. No. 61/121605 (Zu et al.).

The substrate may comprise glass, polymer, adhesives, metals, metallic alloys and/or other materials. The substrate may be a layered structure including a base layer and one or more additional layers or coatings. Some implementations require the substrate and/or the base layer to be substantially transparent, whereas in other implementations, transparency is not important. As previously discussed, the substrate may be a polymeric film in the form of a flat sheet that is sufficiently flexible and strong to be processed in a roll to roll fashion. By roll to roll, what is meant is a process where material is wound onto or unwound from a support, as well as further processed in some way. The substrate can be any thickness. Polymeric films suitable for roll to roll applications can be manufactured in a variety of thickness, ranging in general from about 5 μm to 1000 μm.

The substrate may include thermoplastic and thermoset polymers. Examples of thermoplastics include polyolefins, polyacrylates, polyamides, polyimides, polycarbonates, and polyesters. Further examples of thermoplastics include polyethylene, polypropylene, poly(methylmethacrylate), polycarbonate of bisphenol A, poly(vinyl chloride), polyethylene terephthalate, and poly(vinylidene fluoride).

In some embodiments, the substrate comprises a base layer, e.g., a polymeric base layer, having a metallic coating disposed on at least one major surface of the base layer. The metallic coating may comprise elemental metal, metal alloys, intermetallic compounds, metal oxides, metal sulfides, metal carbides, metal nitrides, or combinations thereof. Exemplary metals include gold, silver, palladium, platinum, rhodium, copper, nickel, iron, indium, tin, tantalum, as well as mixtures, alloys, and compounds of these elements.

Substrates comprising metallic coatings are suitable for use with an ink that forms a SAM resist pattern on the surface of the metallic coating. The metal regions with the ink pattern are retained on the substrate and the metal of the unpatterned regions is removed, e.g., by wet etching, to form a metal pattern. Techniques for wet etching a SAM patterned substrate are described in U.S. Provisional Patent Application Ser. No. 61/220,407 (Zu et al.).

Figure 15:
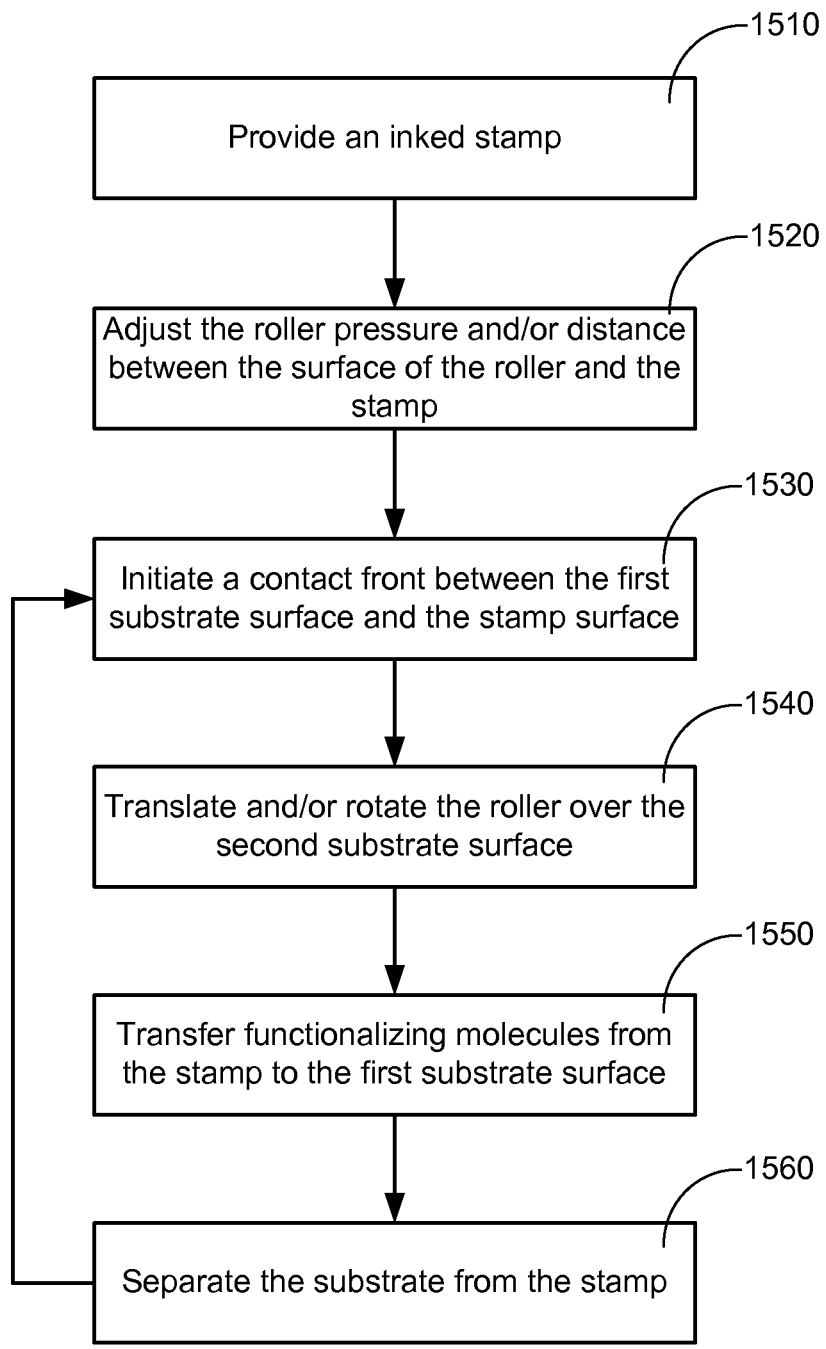
FIG. 15 is a flow diagram of a microcontact printing process.

FIG. 15 is a flow diagram illustrating a microcontact printing process that uses a pressurized roller as described herein to transfer a pattern of functionalizing molecules to a substrate. An inked stamp comprising functionalizing molecules is provided 1510. Initially, the inflatable bladder may be pressurized and/or the distance, d, between the outer surface of the pressurized roller and the stamp surface may be adjusted 1520. For example, the distance may be adjusted to achieve a pressure exerted on the stamp by the roller that is approximately equal to the pressure of the fluid within the inflatable bladder. The substrate is moved into position over the stamp and a contact front is initiated 1530 between the stamp surface and the first surface of the substrate. The roller is translated and may be simultaneously rotated 1540 over the second surface of the substrate bringing the first surface of the substrate into contact with the stamp surface. Functionalizing molecules are transferred 1550 from the stamp to the first substrate surface in the pattern on the stamp. The substrate is separated 1560 from the stamp. If the process is a step and repeat process used to transfer a pattern multiple times to the substrate, then the substrate may be repeatedly repositioned relative to the stamp to expose additional areas of the substrate to the microcontact printing process.

EXAMPLES

Ink Solution and Inking of the Stamp: Ink solutions for printing were prepared by dissolving an alkyl thiol compound in ethanol (200 proof, absolute, anhydrous, Pharmco-Aaper, Shelbyville, Ky.). The ink solutions were prepared with a target concentration. The target concentration was achieved by combining the appropriate masses of alkyl thiol and ethanol, accounting for the molecular weight of the thiol compound and the density of ethanol, as is known in the art. The alkyl thiol used was 10 mM octadecylthiol ("ODT", steryl mercaptan, TCI America, Portland Oreg.). After the thiol compound was dissolved, the stamp was allowed to take up the inking solution from the back side of the stamp. The ink solution diffuses through the bulk of the stamp until, after sufficient time, it is available on the top side of the stamp. This inking process is done in a closed container. In the examples below, the inking time was typically 24 hours.

Substrate: Silver-coated film was used at the substrate for printing. Silver-coated film is comprised of nominally 100 nm of silver sputter coated onto the unprimed side of ST504 PET film. The silver coated substrates were introduced into the microcontact printing tool as sheets (approximately 8"×10") that were hand fed as the roller was engaged. In the examples described below, the thickness of the substrate was 0.125 mm.

Stamp and Stamp Support: The stamp was made by casting Sylgard™ 184 PDMS (Dow Corning, Midland, Mich.) onto a photolithography derived master, followed by heat curing of the stamp for approximately 2 hours at 80 C. The pattern of the stamp relief consisted of raised hexagonal features having 2 micron wide line widths and 200 micron spacing between the hexagons. The stamp relief height was 2 microns. Once inked, the stamp was briefly blown dry with nitrogen to remove and liquid and then placed onto a glass plate for rigid backing of the stamp. This glass plate—stamp construction was then secured into the stamp support base that could then be tilted in x and y, and also moved in the z direction to adjust the gap (also referred to herein as distance, d) between the top surface of the stamp and the bottom surface of the inflated roller. This is the gap that is referred to in Table 1. Note that a negative gap value means that the top of the stamp surface sits above the bottom of the inflatable bladder.

Roller Printing: The pressurized roller used in the examples was composed of an anodized aluminum1 core, having an outer diameter of 2.42 inches and length of 12.2 inches, with a $\frac{1}{16}^{th}$ inch thick rubber bladder having an inner diameter of 2.4 inches and durometer of 50 Shore A (SI Industries, Inc., Blaine, Minn.). The bladder was inflated by introducing nitrogen gas into the space between the roller core and the inside surface of the rubber sleeve. The pressure to which the bladder was inflated was controlled by a regulator (Norgren regulator, model#R07-200-RGAA, 0-10 psig) and gage (Dwyer Instruments Inc, Magnehelic Model 2100 Differential Pressure Gage, measures 0" to 100" w.c.). The pressurized roller was then moved along the plane of the stamp, making contact between the silver-coated surface of the substrate and the top surface of the inked stamp, thereby transferring the functionalizing molecules, in this case the thiol molecules, to the silver surface in the pattern dictated by the surface of the stamp. This patterned monolayer surface served as a resist layer for the subsequent etching process. All examples were printed with a contact time of 5 seconds.

Etching: Etching of the printed silver-coated substrate was done using a ferric nitrate and thiourea etch bath chemistry (20 mM ferric nitrate, 30 mM thiourea, and deionized water). The etchant was prepared just before it was needed. The etchant set up consisted of an etch bath of the composition described above and a bubbler. The bubbler sat at the bottom of the etch bath and bubbled in nitrogen. The printed silver-coated substrates were then placed, printed side down, into the etch bath, allowing it to float on the surface of the etch bath. Typical etch times were 1.5 minutes, after which the printed and etched substrates were removed and rinsed in deionized water, revealing the patterned silver film.

Examples 1-22 are described in the following paragraphs. All samples were made on the same day using the techniques described above. A summary of the print conditions and results is presented in Table 1. Note that a sample labeled as having no defects means that there was no evidence of collapse, voids or other defects in the printed sample. A sample labeled as having some defects means that there were regions of the printed sample that had either collapse or voiding, but it covered less than 25% of the total area. A sample labeled as having many defects means that collapse or voiding was seen for more than approximately 25% of the total print area. The types of defects seen in the samples varied with print conditions and are reported below for each example. However, in general, collapse is seen for higher applied pressures, i.e. bladder pressures, and for smaller gaps. Voiding is typically seen for lower applied pressures, i.e. bladder pressures, and for higher gaps. Table 1 provides print quality results for various gaps (between top surface of stamp and bottom surface of the inflated roller), and bladder pressure settings.

TABLE 1

| Gap(+0.15 mm) | | | | | |
|---|---|---|---|---|---|
| −0.33 | | | C | C | C |
| −0.18 | | | A | A | A |
| −0.03 | B | B | A | A | |
| 0.1 | B | B | A | A | |
| 0.25 | B | C | B | A | |
| 0.4 | C | C | C | C | |
| Bladder Pressure (psi) | 1.6 | 1.8 | 2 | 2.2 | 2.5 |

A no defects
B some defects
C many defects

Example 1

Figure 16:
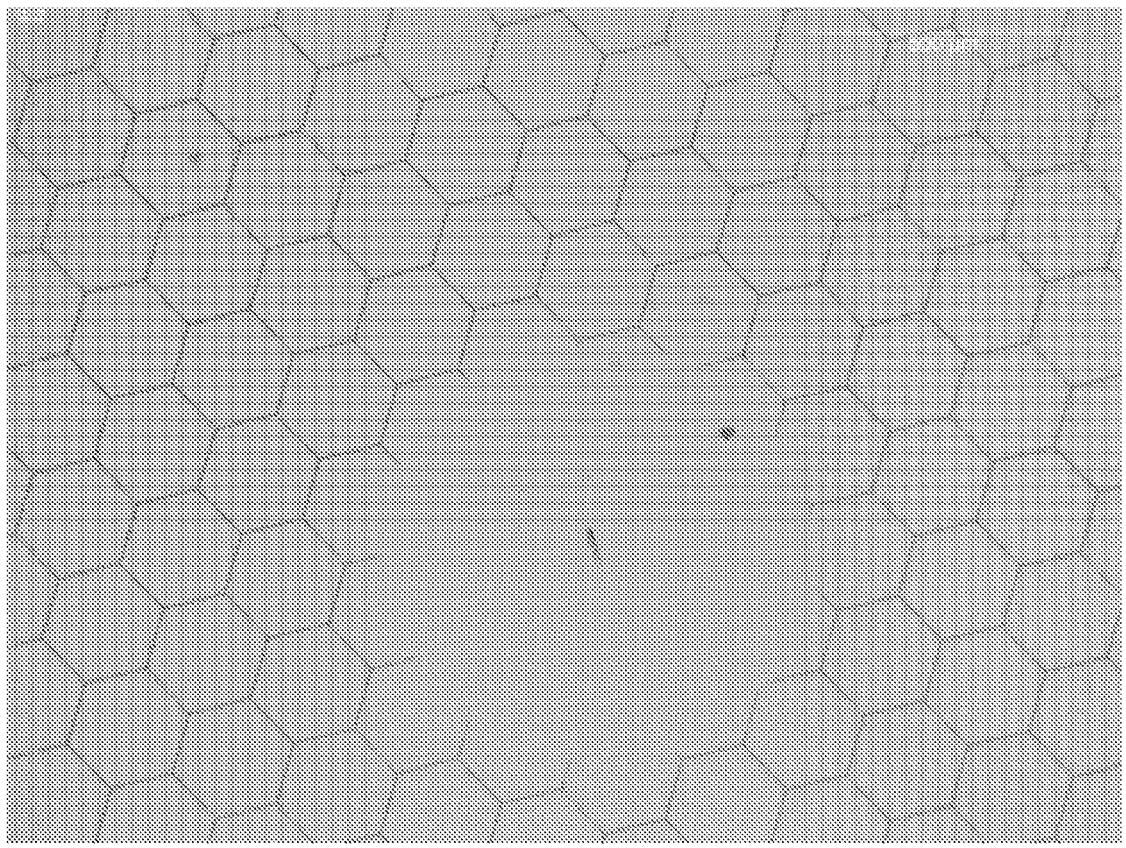
FIG. 16 is an optical micrograph (transmission mode) of a region of a printed sample having a void defect.

A patterned silver-coated PET film was created using the techniques described above. The print conditions used were a gap of 0.4 mm (±0.15 mm) between the top surface of the stamp and the bottom surface of the roller, and a pressure in the bladder of 1.5 psi. The print time was 5 seconds, after which the printed sample was etched for 1.5 minutes. This resulted in a sample characterized by many void defects, and so received a C rating, as seen in Table 1. A characteristic image of such a defect region is seen in FIG. 16. FIG. 16 is an optical micrograph (transmission mode) of a region of a printed sample having a void defect. Note that the dark regions are the patterned silver and the lighter regions are where the silver was removed by etching.

Example 2

A patterned silver-coated PET film was created using the techniques described above. The print conditions used were a gap of 0.4 mm (±0.15 mm) between the top surface of the stamp and the bottom surface of the roller, and a pressure in the bladder of 1.8 psi. The print time was 5 seconds, after which the printed sample was etched for 1.5 minutes. This resulted in a sample characterized by many void defects, and so received a C rating, as seen in Table 1. A characteristic image of such a defect region is seen in FIG. 16.

Example 3

A patterned silver-coated PET film was created using the techniques described above. The print conditions used were a gap of 0.4 mm (±0.15 mm) between the top surface of the stamp and the bottom surface of the roller, and a pressure in the bladder of 2.0 psi. The print time was 5 seconds, after which the printed sample was etched for 1.5 minutes. This resulted in a sample characterized by many void defects, and so received a C rating, as seen in Table 1. A characteristic image of such a defect region is seen in FIG. 16.

Example 4

A patterned silver-coated PET film was created using the techniques described above. The print conditions used were a gap of 0.4 mm (±0.15 mm) between the top surface of the stamp and the bottom surface of the roller, and a pressure in the bladder of 2.2 psi. The print time was 5 seconds, after which the printed sample was etched for 1.5 minutes. This resulted in a sample characterized by many void defects, and so received a C rating, as seen in Table 1. A characteristic image of such a defect region is seen in FIG. 16.

Example 5

A patterned silver-coated PET film was created using the techniques described above. The print conditions used were a gap of 0.25 mm (±0.15 mm) between the top surface of the stamp and the bottom surface of the roller, and a pressure in the bladder of 1.6 psi. The print time was 5 seconds, after which the printed sample was etched for 1.5 minutes. This resulted in a sample characterized by some void defects, and so received a B rating, as seen in Table 1. A characteristic image of such a defect region is seen in FIG. 16.

Example 6

A patterned silver-coated PET film was created using the techniques described above. The print conditions used were a gap of 0.25 mm (±0.15 mm) between the top surface of the stamp and the bottom surface of the roller, and a pressure in the bladder of 1.8 psi. The print time was 5 seconds, after which the printed sample was etched for 1.5 minutes. This resulted in a sample characterized by many void defects, and so received a C rating, as seen in Table 1. A characteristic image of such a defect region is seen in FIG. 16.

Example 7

A patterned silver-coated PET film was created using the techniques described above. The print conditions used were a gap of 0.25 mm (±0.15 mm) between the top surface of the stamp and the bottom surface of the roller, and a pressure in the bladder of 2.0 psi. The print time was 5 seconds, after which the printed sample was etched for 1.5 minutes. This resulted in a sample characterized by some void defects, and so received a B rating, as seen in Table 1. A characteristic image of such a defect region is seen in FIG. 16.

Example 8

Figure 17:
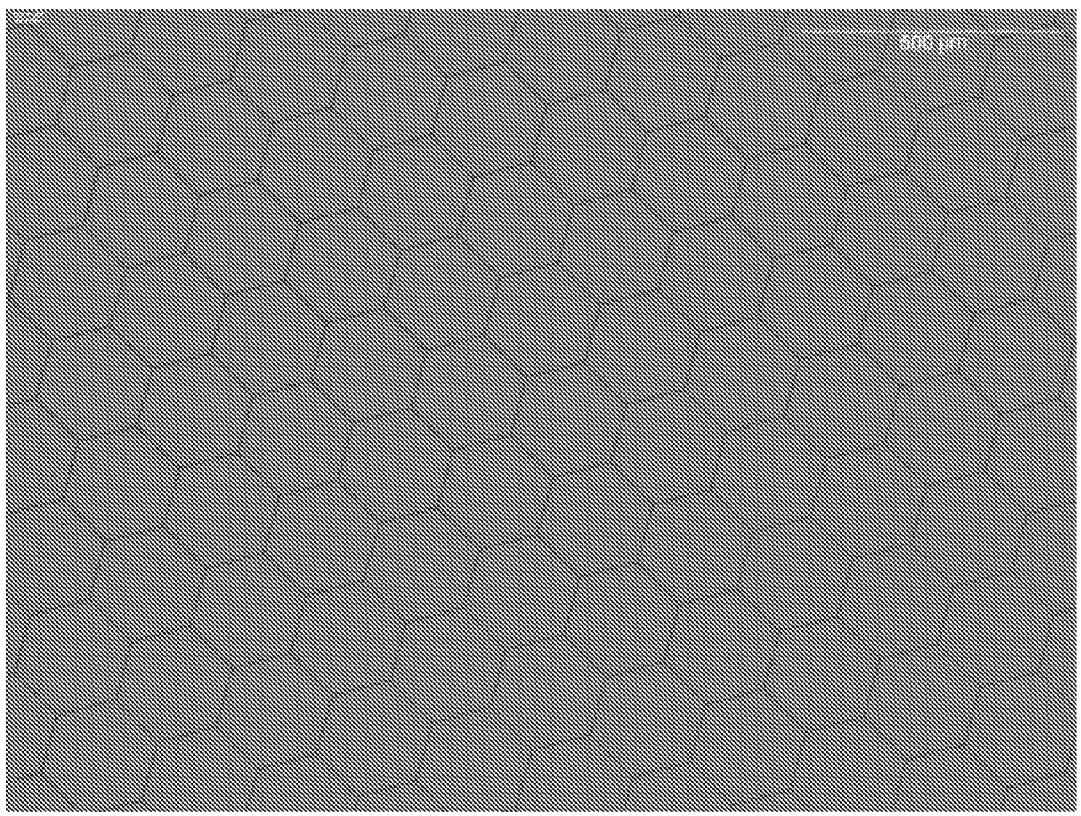
FIG. 17 is an optical micrograph (transmission mode) of a region of a printed sample having no defects.

A patterned silver-coated PET film was created using the techniques described above. The print conditions used were a gap of 0.25 mm (±0.15 mm) between the top surface of the stamp and the bottom surface of the roller, and a pressure in the bladder of 2.2 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17. FIG. 17 is an optical micrograph (transmission mode) of a region of a printed sample having no defects. Note that the dark regions are the patterned silver and the lighter regions are where the silver was removed by etching.

Example 9

A patterned silver-coated PET film was created using the techniques described above. The print conditions used were a gap of 0.1 mm (±0.15 mm) between the top surface of the stamp and the bottom surface of the roller, and a pressure in the bladder of 1.6 psi. The print time was 5 seconds, after which the printed sample was etched for 1.5 minutes. This resulted in a sample characterized by some void defects, and so received a B rating, as seen in Table 1. A characteristic image of such a defect region is seen in FIG. 16.

Example 10

A patterned silver-coated PET film was created using the techniques described above. The print conditions used were a gap of 0.1 mm (±0.15 mm) between the top surface of the stamp and the bottom surface of the roller, and a pressure in the bladder of 1.8 psi. The print time was 5 seconds, after which the printed sample was etched for 1.5 minutes. This resulted in a sample characterized by many void defects, and so received a C rating, as seen in Table 1. A characteristic image of such a defect region is seen in FIG. 16.

Example 11

A patterned silver-coated PET film was created using the techniques described above. The print conditions used were a gap of 0.1 mm (±0.15 mm) between the top surface of the stamp and the bottom surface of the roller, and a pressure in the bladder of 2.0 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 12

A patterned silver-coated PET film was created using the techniques described above. The print conditions used were a gap of 0.1 mm (±0.15 mm) between the top surface of the stamp and the bottom surface of the roller, and a pressure in the bladder of 2.2 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 13

A patterned silver-coated PET film was created using the techniques described above. The print conditions used were a gap of −0.03 mm (±0.15 mm) between the top surface of the stamp and the bottom surface of the roller, and a pressure in the bladder of 1.6 psi. The print time was 5 seconds, after which the printed sample was etched for 1.5 minutes. This resulted in a sample characterized by some void defects, and so received a B rating, as seen in Table 1. A characteristic image of such a defect region is seen in FIG. 16.

Example 14

A patterned silver-coated PET film was created using the techniques described above. The print conditions used were a gap of −0.03 mm (±0.15 mm) between the top surface of the stamp and the bottom surface of the roller, and a pressure in the bladder of 1.8 psi. The print time was 5 seconds, after which the printed sample was etched for 1.5 minutes. This resulted in a sample characterized by some void defects, and so received a B rating, as seen in Table 1. A characteristic image of such a defect region is seen in FIG. 16.

Example 15

A patterned silver-coated PET film was created using the techniques described above. The print conditions used were a gap of −0.03 mm (±0.15 mm) between the top surface of the stamp and the bottom surface of the roller, and a pressure in the bladder of 2.0 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 16

A patterned silver-coated PET film was created using the techniques described above. The print conditions used were a gap of −0.03 mm (±0.15 mm) between the top surface of the stamp and the bottom surface of the roller, and a pressure in the bladder of 2.2 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 17

A patterned silver-coated PET film was created using the techniques described above. The print conditions used were a gap of −0.18 mm (±0.15 mm) between the top surface of the stamp and the bottom surface of the roller, and a pressure in the bladder of 2.0 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 18

A patterned silver-coated PET film was created using the techniques described above. The print conditions used were a gap of −0.18 mm (±0.15 mm) between the top surface of the stamp and the bottom surface of the roller, and a pressure in the bladder of 2.2 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 19

A patterned silver-coated PET film was created using the techniques described above. The print conditions used were a gap of −0.18 mm (±0.15 mm) between the top surface of the stamp and the bottom surface of the roller, and a pressure in the bladder of 2.5 psi. The print time was 5 seconds, after which the printed sample was etched for 1.5 minutes. This resulted in a sample characterized by no defects, and so received an A rating, as seen in Table 1. A characteristic image of such a sample with no defects is seen in FIG. 17.

Example 20

Figure 18:
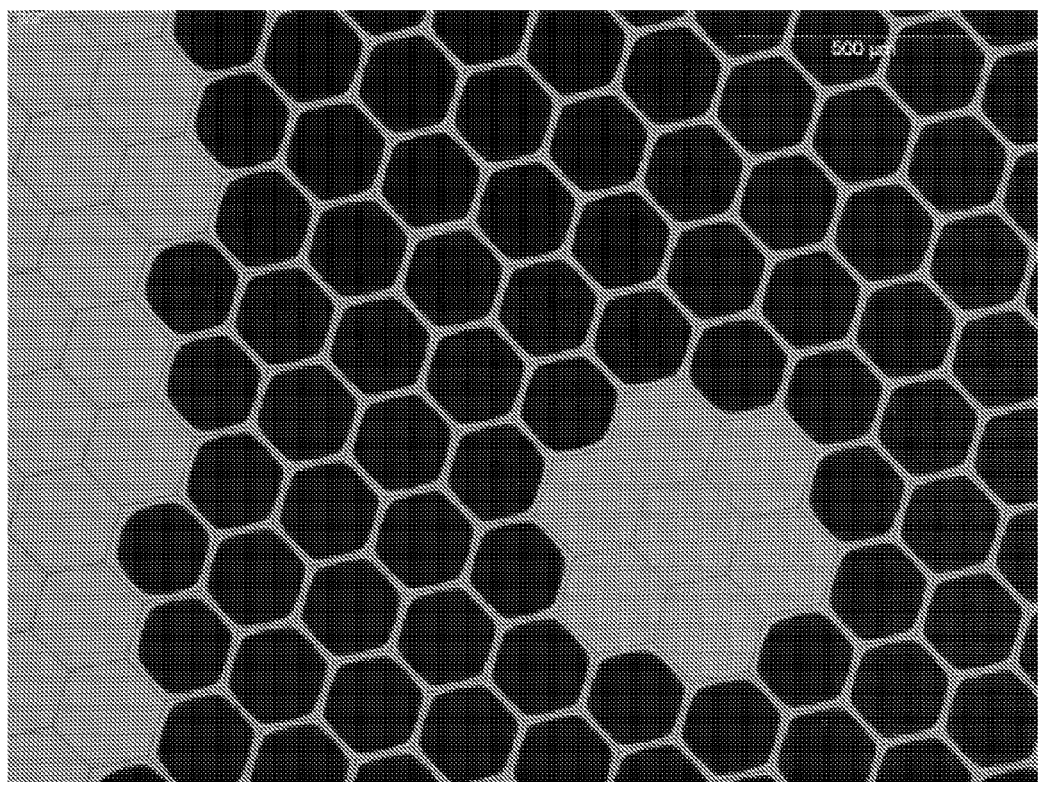
FIG. 18 is an optical micrograph (transmission mode) of a region of a printed sample having collapse defects.

A patterned silver-coated PET film was created using the techniques described above. The print conditions used were a gap of −0.33 mm (±0.15 mm) between the top surface of the stamp and the bottom surface of the roller, and a pressure in the bladder of 2.0 psi. The print time was 5 seconds, after which the printed sample was etched for 1.5 minutes. This resulted in a sample characterized by many collapse defects, and so received a C rating, as seen in Table 1. A characteristic image of such a defect region is seen in FIG. 18. FIG. 18 is an optical micrograph (transmission mode) of a region of a printed sample having collapse defects. Note that the dark regions are the patterned silver and the lighter regions are where the silver was removed by etching.

Example 21

A patterned silver-coated PET film was created using the techniques described above. The print conditions used were a gap of −0.33 mm (±0.15 mm) between the top surface of the stamp and the bottom surface of the roller, and a pressure in the bladder of 2.2 psi. The print time was 5 seconds, after which the printed sample was etched for 1.5 minutes. This resulted in a sample characterized by many collapse defects, and so received a C rating, as seen in Table 1. A characteristic image of such a defect region is seen in FIG. 18.

Example 22

A patterned silver-coated PET film was created using the techniques described above. The print conditions used were a gap of −0.33 mm (±0.15 mm) between the top surface of the stamp and the bottom surface of the roller, and a pressure in the bladder of 2.5 psi. The print time was 5 seconds, after which the printed sample was etched for 1.5 minutes. This resulted in a sample characterized by many collapse defects, and so received a C rating, as seen in Table 1. A characteristic image of such a defect region is seen in FIG. 18.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the appended claims.

What is claimed is:
1. A method of microcontact printing, comprising:
providing a planar inked stamp comprising functionalizing molecules;
orienting a first surface of a substrate towards a surface of the inked stamp;
contacting the first surface of the substrate to the surface of the inked stamp;
rolling a pressurized roller over a second surface of the substrate; and
transferring at least a portion of the functionalizing molecules from the surface of the planar inked stamp to the first surface of the substrate, wherein the pressurized roller includes an inflatable bladder that is pressurized by a fluid, the inflatable bladder comprising an outer wall that contacts the second surface of the substrate when the pressurized roller is rolled, and wherein the inflatable bladder does not include internal supports within an interior volume of the inflatable bladder.

2. The method of claim 1, wherein the inflatable bladder is pressurized to less than about 20 psi.

3. The method of claim 1, wherein the outer wall of the inflatable bladder comprises an elastomeric wall having a thickness of between about 0.1 millimeter and about 3 millimeters.

4. The method of claim 1, wherein a material of an outer surface of the inflatable bladder has a durometer in a range of about 30 to about 80 Shore A.

5. The method of claim 1, wherein rolling the pressurized roller over the second surface of the substrate imparts a pressure of less than 20 psi to the surface of the stamp.

6. The method of claim 1, wherein:
contacting the surface of the inked stamp to the first surface of the substrate comprises forming a contact front between the first surface of the substrate and the surface of the inked stamp at the point of contact, and wherein a tangent to a portion of the first surface of the substrate that is adjacent to a point of contact between the surface of the inked stamp and the first surface of the substrate makes an angle with the plane of the stamp.

7. The method of claim 1, wherein rolling the pressurized roller over the second surface of the substrate comprises propagating a contact front between the first surface of the substrate and the surface of the inked stamp during the rolling.

8. The method of claim 1, further comprising adjusting the pressure applied to the surface of the inked stamp by the pressurized roller by one or both of adjusting a pressure of the fluid within the pressurized roller and adjusting a distance between an outer surface of the pressurized roller and the surface of the inked stamp.

9. A microcontact printing apparatus, comprising:
a planar stamp;
a roller, comprising an inflatable bladder configured to be pressurized by a fluid, the inflatable bladder comprising an outer wall that is an outer surface of the roller, and wherein the inflatable bladder does not include internal supports within an interior volume of the inflatable bladder; and
an actuator configured to provide relative movement between the pressurized roller and the stamp in a direction substantially parallel to a surface of the stamp while the pressurized roller applies pressure to the planar stamp.

10. The apparatus of claim 9, further comprising an adjustment mechanism configured to adjust a distance between the outer surface of the pressurized roller and the surface of the stamp.

11. The apparatus of claim 9, wherein the actuator comprises a control system configured to automatically provide the relative movement.

12. The apparatus of claim 9, wherein the pressurized roller rotates during the relative movement and the actuator comprises a motorized drive mechanism configured to rotate the roller.

13. The apparatus of claim 9, wherein the planar stamp comprises a relief pattern on the surface of the stamp, the relief pattern having raised regions and recessed regions, and a minimum lateral dimension of the raised regions is less than about 10 microns, a maximum lateral separation between adjacent raised regions is at least about 50 microns, and a height of the relief pattern between the raised regions and the recessed regions is less than about 10 microns.

14. The apparatus of claim 9, wherein the inflatable bladder is configured to be pressurized by a fluid to less than about 20 psi.

15. A microcontact printing roller having a longitudinal axis, comprising:
an inflatable bladder comprising an elastomeric wall, the inflatable bladder configured to be pressurized by a fluid, wherein an outer surface of the roller is configured to have a height variation of less than 1 mm per 1 cm of width across a width of at least 5 cm along the longitudinal axis when the inflatable bladder is pressurized;
wherein: i) the elastomeric wall comprises an expandable foam; or
ii)
the elastomeric wall is disposed between an expandable foam layer and an outer wall that expands away from the elastomeric wall when the bladder is pressurized.

16. The roller of claim 15, wherein the inflatable bladder does not include internal supports within an interior volume of the inflatable bladder.

17. The roller of claim 15, wherein the elastomeric wall comprises the expandable foam.

18. The roller of claim 15, wherein the roller comprises one or more additional layers disposed over an outer surface of the inflatable bladder, wherein the elastomeric wall is disposed between the expandable foam layer and the one additional layer comprises the outer wall.

19. The roller of claim 15, wherein a material of an outer surface of the inflatable bladder has a durometer between about 30 and about 80 Shore A.

* * * * *

UNITED STATES PATENT AND TRADEMARK OFFICE
CERTIFICATE OF CORRECTION

PATENT NO.       : 8,950,324 B2                                              Page 1 of 1
APPLICATION NO.  : 13/514170
DATED            : February 10, 2015
INVENTOR(S)      : Tracie Berniard It is certified that error appears in the above-identified patent and that said Letters Patent is hereby corrected as shown below:

In the Specification

Column 1,
Lines 11-12, delete "incorported" and insert -- incorporated --, therefor.

Column 13,
Lines 35-47, delete "Functionalizing molecules are.......about 3psi." and insert the same on Col. 13, line 34, after "thickness." as a continuation of the same paragraph.

Column 22,
Line 20, delete "Gap(+0.15mm)" and insert -- Gap(±0.15mm) --, therefor.

Signed and Sealed this
Fourteenth Day of July, 2015

Michelle K. Lee
*Director of the United States Patent and Trademark Office*